United States Patent [19]

Murakami et al.

[11] Patent Number: 4,974,065
[45] Date of Patent: Nov. 27, 1990

[54] ADAPTIVE COMB FILTER

[75] Inventors: Tokumichi Murakami; Atsushi Ito; Kohtaro Asai, all of Kanagawa, Japan

[73] Assignee: Mitsubishi Denki Kabushiki Kaisha, Tokyo, Japan

[21] Appl. No.: 251,990

[22] Filed: Sep. 29, 1988

Related U.S. Application Data

[63] Continuation of Ser. No. 98,592, Sep. 18, 1987, abandoned, which is a continuation of Ser. No. 84,836, Dec. 21, 1984, abandoned.

[30] Foreign Application Priority Data

| Dec. 12, 1983 | [JP] | Japan | 58-242367 |
| Jan. 24, 1984 | [JP] | Japan | 59-21147 |
| Mar. 5, 1984 | [JP] | Japan | 59-82506 |
| Apr. 20, 1984 | [JP] | Japan | 59-123089 |

[51] Int. Cl.$^5$ .............................................. H04N 9/78
[52] U.S. Cl. .................................................... 358/31
[58] Field of Search ......................................... 358/31

[56] References Cited

U.S. PATENT DOCUMENTS

| 2,921,124 | 1/1960 | Graham | 358/138 |
| 4,141,035 | 2/1979 | Maxemchuk et al. | 358/31 |
| 4,352,122 | 9/1982 | Reitmeier et al. | 358/31 X |
| 4,464,686 | 8/1984 | Reitmeier | 358/36 |
| 4,605,966 | 8/1986 | Collins | 358/21 R |
| 4,626,895 | 12/1986 | Reitmeier | 358/31 |

FOREIGN PATENT DOCUMENTS

| 123280 | 9/1980 | Japan | 358/31 |
| 54795 | 3/1983 | Japan | 358/31 |
| 129890 | 8/1983 | Japan | 358/31 |
| 129891 | 8/1983 | Japan | 358/31 |
| 2079091 | 1/1982 | United Kingdom | 358/31 |

OTHER PUBLICATIONS

Maxemchuk et al., Separation of NTSC Signals by Minimum Mean Square Error Filters and Adaptive Filters, IEEE Transactions on Communications, vol. COM 26, No. 5, May 1978, pp. 583–593.
Yoshimitsu Nakajima et al, Improvement of Picture Quality of NTSL and PAL Systems by Digital Signal Processing, IEEE Transactions on Consumer Electronics, vol. CE-31, No. 4, Nov. 1985.
J. P. Rossi, "Digital TV Comb Filter with Adaptive Features", IEEE Conf. Proc., 1976, pp. 267–282.
T. O. Okada, "New Filter Technology in Picture Processing", IEEE Trans., vol. CE-28, No, 3, 157–167, 1982.
J. P. Rossi, "Sub-Nyquist-Encoded PCM NTSC Color Television", *SMPTE Journal,* Jan. 1976, vol. 85, No. 1, pp. 1–6.

Primary Examiner—John W. Shepperd
Attorney, Agent, or Firm—Sughrue, Mion, Zinn, Macpeak & Seas

[57] ABSTRACT

Various filter circuits for processing digitized color television signals are disclosed. Particularly, there are disclosed several embodiments of a luminance/chrominance signal separating filter with which separated, digitized luminance and chrominance are derived with a minimum amount of interference therebetween by determining the direction from a given point in which there is a minimum amount of change in the digitized image signal. Also, there is disclosed a subnyquist sampling filter which operates upon this same principle.

10 Claims, 17 Drawing Sheets $$S(i,j) = Y(i,j) + C(i,j)$$

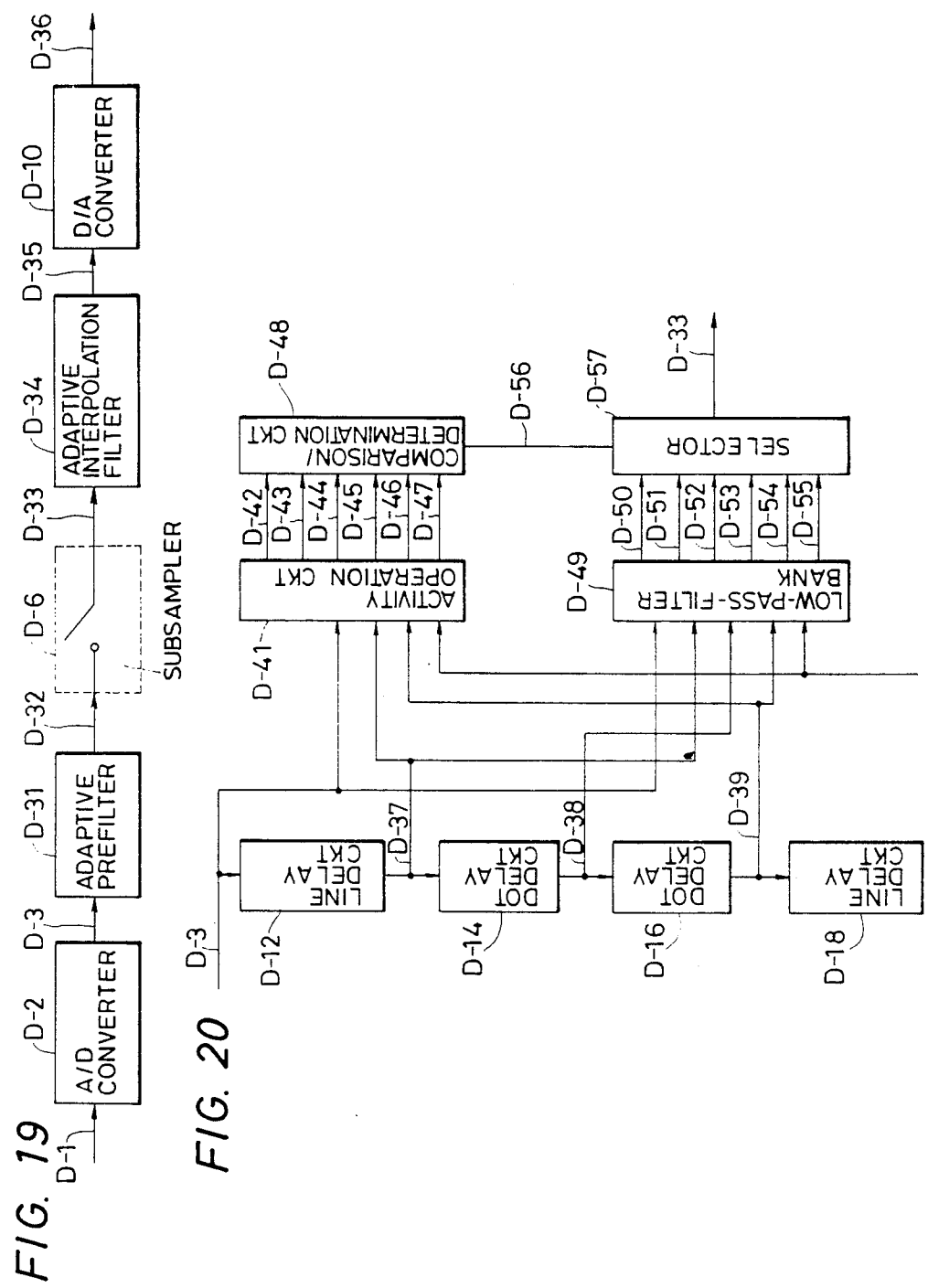

ADAPTIVE COMB FILTER

This is a continuation of application Ser. No. 07/098,592 filed Sept. 18, 1987, which is a continuation of application Ser. No. 06/684,836 filed 12/21/84 now abandoned.

BACKGROUND OF THE INVENTION

The present invention relates to an adaptive comb filter for deriving a luminance signal (commonly referred to as the Y signal) and a chrominance signal (commonly referred to as the C signal) from a color television signal such as an NTSC color television signal separately in a digital manner by A/D conversion of a color television signal.

A signal sequence $S(i,j)$, for $i=1,2,3 \ldots m$ and $j=1,2,3 \ldots n$, obtained by digitizing an analog NTSC signal is shown in FIG. 1. A sampling frequency $f_s$ used to digitize the NTSC signal is usually four times the color subcarrier frequency $f_{sc}$. In FIG. 1, a sample $S(i,j)$ is represented by a sum of a Y signal sample $Y(i,j)$ and a C signal sample $C(i,j)$; that is, $S(i,j)=Y(i,j)+C(i,j)$.

For the usual television signal, there is a strong correlation between adjacent samples in both the vertical and horizontal directions in one field. Furthermore, in the NTSC system in which interlaced scanning is performed, the phase of the C signal is reversed every line, that is, the polarity of C changes every two samples as shown in FIG. 2. Taking advantage of this property, it is possible to separate the Y signal and the C signal from the NTSC signal in a digital manner.

FIG. 3 shows the construction of a conventional Y and C signal separating comb filter. In FIG. 3, the filter includes an A/D converter 1 for digitizing the analog NTSC signal on a line 101, a vertical filter 2 for deriving from an output of the A/D converter 1 on a line 102 a line alternating signal $H_c$ ($H_c=D+C$ where D represents a high frequency component of the Y signal in the vertical direction and a low frequency component of the same in the horizontal direction), a bandpass filter 3 receiving the low frequency component in the output of the vertical filter 2 on a line 103 and outputting the C signal on a line 105, a delay element 4 for compensating for delays in the filters 2 and 3, and a subtractor 5 for obtaining a difference between an output of the bandpass filter 3 on the line 105 and an output of the delay element 4 on a line 106.

In operation, the analog NTSC signal on the line 101 is digitized by being sampled by the A/D converter 1 with a predetermined sampling frequency $f_s$ ($f_s=4f_{sc}$) to obtain a digital signal series $S(i,j)$ on the line 102. The digital signal series $S(i,j)$ on the line 102 is filtered by the vertical filter 2.

FIG. 4 shows the vertical filter 2 in detail. The filter 2 includes a pair of series-connected line buffer memories 6, each delaying the input signal on the line 102 by a period of one line, an adder 7 for summing the output of the A/D converter 1 and an output of the second of the line buffer memories 6, a multiplier 8 for multiplying an output of the adder 7 by ¼, a multiplier 9 for multiplying the output of a first of the line buffer memories 6 by ½, and a subtractor 10 for obtaining a difference between outputs of the multipliers 8 and 9.

In the vertical filter 2, in order to obtain a line alternating signal $H_c(i,j)$ for the sample $S(i,j)$, samples $S(i,j-1)$, $S(i,j)$ and $S(i,j+1)$ of the output sample series of the A/D converter on lines 108, 104 and 102, respectively, are used. That is, when the sample $S(i,j)$ is selected, sample values in lines just above and below the selected line are used to perform the following operation:

$$H_c(i,j) = -(\tfrac{1}{4})S(i,j-1) + \tfrac{1}{2} S(i,j) - (\tfrac{1}{4})S(i,j+1).$$

The signal $H_c(i,j)$ appears on the line 103.

As a result, the vertical, low frequency component of the Y signal for the sample $S(i,j)$ is removed. The $H_c$ signal on the line 103 is supplied to the bandpass filter 3 to remove the horizontal low frequency component D of the Y signal, as a result of which a C signal for the sample $S(i,j)$ is obtained on the line 105. At this time, the Y signal is obtained on a line 107 by operations based on the following equation:

$$Y(i,j) = S(i,j) - C(i,j).$$

In the conventional YC separation comb filter constructed as above, if the video information component of the color television signal varies strongly in the horizontal direction, the energy of the horizontal high frequency component of the Y signal becomes predominant. Therefore, a portion of the horizontal high frequency component of the Y signal still remains in the $H_c$ signal because it is very difficult to realize sharp cutoff characteristics of the bandpass filter 3. Consequently, the YC separation is poor, resulting in the Y signal on the line 107 containing a strong C-signal component mixed therein. Furthermore, since the horizontal high frequency component which is not removed from the Y signal affects the $H_c$ signal for the next subsequent line, the response of the YC separation comb filter to variations of the television signal in the vertical direction is degraded.

Further, an NTSC composite color television signal S is a composite signal composed of a luminance signal Y and a chrominance signal C obtained by quadrature two-level phase modulation of two color difference signals U and V (or I and Q) with a color subcarrier frequency $f_{sc}$ and can be represented by:

$$S = Y + C = Y + U \sin(2\pi f_{sc} t) + V \cos(2\pi f_{sc} t).$$

Representing the frame frequency, the field frequency and the horizontal scanning frequency by $f_F (=30 \text{ Hz})$, $f_V$ and $f_H$, respectively:

$$f_{sc} = (455/2)f_H = (455/2) \cdot (525/2) \cdot f_V = (455/2) \cdot 525 f_F.$$

Therefore, when the NTSC composite color television signal is sampled with a sampling frequency $f_s$ four times the color subcarrier frequency $f_{sc}$, the sample signals are arranged two dimensionally on the image plane as shown in FIG. 5. That is, four samples are derived in one period of the color subcarrier, which are color signals C whose phases are inverted every line.

On the other hand, the PAL composite color television signal P can be represented by:

$$P = Y + U \sin(2\pi f_{sc}' t) \pm V \cos(2\pi f_{sc}' t),$$

where $f_{sc}'$ is the color subcarrier frequency. The + sign in the above equation occurs for the even-numbered scanning lines and the − sign occurs for the odd-numbered scanning lines. That is, the V component is inverted every scanning line.

Representing the frame frequency, the field frequency and the horizontal scanning frequency by $f_F'$ ($=25$ Hz), $f_V'$ and $f_H'$, respectively:

$$f_{sc}' = (284 - \tfrac{1}{4} + 1/625)f_H' = (284 - \tfrac{1}{4} + 1/625) \cdot (625/2) \cdot f_V' = (284 - \tfrac{1}{4} + 1/625) \cdot 625 f_F'.$$

That is, the color subcarrier frequency $f_{sc}'$ and the horizontal scanning frequency $f_H$ differ by an amount corresponding to ¼ line. For this reason, the signal sample obtained by sampling the PAL composite color television signal with a sampling frequency $f_s'$ four times the color subcarrier frequency $f_{sc}'$ are arranged two dimensionally as shown in FIG. 6. That is, the phase of the color signal becomes the same after four time periods.

It is necessary, as mentioned above, in a television receiver to correctly separate the luminance signal Y and the chrominance signal C from the composite color television signal containing a color signal which is frequency-multiplied to obtain compatibility with a monochromatic television signal such that the spectrum thereof is frequency-interleaved in the luminance signal region.

FIG. 7 shows the construction of another conventional YC signal separating filter for realizing the above separations. In FIG. 7, reference numerals B-1, B-2, B-3 and B-4 depict a one-line delay circuit, a vertical filter, a horizontal filter and a subtractor, respectively.

The operation of this filter, used for NTSC composite color television signal separation, will be described.

The composite color television input signal on a line B-101, which is sampled in synchronism with the color subcarrier with a sampling frequency $f_s = 4f_{sc}$, is arranged two dimensionally as shown in FIG. 5. One sample delay and one line delay are represented by Z transformations $Z^{-1}$ and $Z^{-l}$, respectively, where:

$$Z^{-1} = \exp[-j2 \cdot \pi \cdot f/4f_{sc}].$$

Since $f_{sc} = (455/2)f_H$, $l = 910$. A line alternating signal containing the color signal is obtained by the vertical filter B-2 on the basis of the input signal on the line B-101, a one-line delayed input signal from a first one of the series-connected one-line delay circuits B-1 and a two-line delayed input signal from the second one-line delay circuit B-1. The transfer function $H_v(Z)$ of the vertical filter B-2 is:

$$H_v(Z) = -(\tfrac{1}{2})(1 - Z^{-l})^2.$$

That is, assuming that the video information content of the television signal is similar between adjacent image elements, the line alternating signal $H_c$ at a coordinate (m,n) in FIG. 5 is derived as:

$$H_c(m,n) = -(\tfrac{1}{4})[S(m,n-1) - 2S(m,n) + S(m,n+1)].$$

The signal $H_c$ contains the luminance signal Y. Therefore, the color signal C(m,n), which is a high-frequency component of the signal ($H_c(m,n)$, is separated by the horizontal bandpass filter B-3 from the latter signal. The color signal on a line B-105 is fed to the subtractor B-4 and there used to separate the luminance signal Y(m,n) according to:

$$Y(m,n) = S(m,n) - C(m,n).$$

The transfer function $H_h(Z)$ of the bandpass filter B-3 may be represented as follows:

$$H_h(Z) = -(1/32)(1 - Z^{-2})^2 (1 + Z^{-4})^2 (1 + Z^{-8}).$$

As to the operation of the filter for a PAL composite color television signal, the composite color television input signal sampled in synchronism with the color subcarrier with sampling frequency $f_s' = 4f_{sc}$ contains the color signal whose phase is arranged as shown in FIG. 6. That is, the color signal phase becomes the same every four line periods and, for even numbered lines, the color signal component whose color subcarrier phase changes by 180° corresponds to a preceding line while, for odd numbered lines, it corresponds to a subsequent line. Therefore, in order to obtain the PAL four-line alternating signal $H_c'$ corresponding to the NTSC line alternating signal with the vertical filter B-2, the operation thereof is switched between odd- and even-numbered lines. That is for odd numbered lines:

$$H_c'(m, 2n-1) = (\tfrac{1}{2})[P(m, 2n-1) - P(m, 2n)],$$

while for even numbered lines:

$$H_c'(m, 2n) = (\tfrac{1}{2})[P(m, 2n) - P(m, 2n-1)].$$

In other words, the alternating signal is derived by using a pair of vertically paired sample points on paired lines and the color signal C(m,n) is obtained from the horizontal bandpass filter B-3.

In this conventional luminance/chrominance separating filter, the fixed vertical filter and the horizontal filter are combined, with the assumption that adjacent image elements in the sampled television signal are similar to each other. However, if this is not the case, the luminance signal and the chrominance signal will interfere with one another, particularly in a region in which the luminance and chrominance of the image vary strongly, resulting in distortions in the reproduced image such as color fading and indistinct boundaries.

Another digital filter of the prior art used for the NTSC system is shown in FIG. 8. In this figure, C-1 is a vertical filter, C-2 is a band-pass filter, and C-3 is a subtractor. The vertical filter C-1 is composed of a vertical filter operation circuit C-10 and one-line delay circuits C-11 and C-12. C-101 to C-106 indicate signal lines.

Here, it is presumed that the signal S indicated in the equation above is input to the signal line C-101 as the digitized signal S as shown in FIG. 1. Thus, the signal S(m,n) is present on the signal line C-102 as the output of the one line delay circuit C-11, while the signal S(m,n−1) is present on the signal line C-103 as an output of the one-line delay circuit C-12.

The operation circuit C-10 executes the operations of $H_c(m,n) = -(\tfrac{1}{4})[S(m,n-1) - 2S(m,n) + S(m,n+1)]$ and outputs $H_c(m,n)$. Here, the signals S(m,n−1), S(m,n) and S(m,n+1) are on adjacent lines in the vertical direction, and therefore the values of Y, U and V in the equation above must be very approximate in general.

Values of Y and C are assumed respectively to be $(Y_0 + \Delta Y_1, C_0 + \Delta C_1)$, $(Y_0, C_0)$ and $(Y_0 + \Delta Y_2, C_0 + \Delta C_2)$ for the signals of S(m,n−1), S(m,n) and S(m,n+1). In this case, the values $\Delta Y_1$, $\Delta Y_2$, $\Delta C_1$ and $\Delta C_2$ are generally very small. Accordingly, $H_c(m,n)$ is as follows:

$$H_c(m,n) = -(\tfrac{1}{4})[(\Delta Y_1 + \Delta Y_2) - 4C_0 + (-\Delta C_1 - \Delta C_2)]$$
$$= C_0 + (\tfrac{1}{4})(\Delta C_1 + \Delta C_2) - (\tfrac{1}{4})(\Delta Y_1 + \Delta Y_2).$$

The signal S(m+1,n+1) follows the signal S(m,n+1) on the signal line C-101. In this case, the output $H_c(m+1,n)$ of the operation circuit C-10 can be expressed as:

$$H_c(m+1n) = -(\tfrac{1}{4})[(\Delta Y_1' + \Delta Y_2') - 4C_0' + (-\Delta C_1' - \Delta C_2')]$$
$$= C_0' + (\tfrac{1}{4})(\Delta C_1' + \Delta C_2') - (\tfrac{1}{4})(\Delta Y_1' + \Delta Y_2')$$

In these equations, the values $\Delta C_1$, $\Delta C_2$, $\Delta C_1'$, $\Delta C_2'$, $\Delta Y_1$, $\Delta Y_2$, $\Delta Y_1'$ and $\Delta Y_2'$ are generally very small. Values of Y and C are assumed respectively to be $(Y_0' + \Delta Y_1', C_0' + \Delta C_1')$, $(Y_0', C_0')$ and $(Y_0' + \Delta Y_2', C_0 + \Delta C_2')$ for the signals of $S(m+1, n-1)$, $S(m+1,n)$ and $S(m+1, n+1)$. Namely, the signal S applied to the vertical filter C-1 includes a digitized luminance signal Y and a chrominance signal C, and it is clear from the two equations immediately above that the luminance signal Y is strongly attenuated with respect to the output of the operation circuit C-10.

Delays of one sampling period and of one line period are respectively represented as $Z^{-1}$ and $Z^{-l}$ using a Z transform.

$$Z^{-1} = \exp[-j2\pi f/f_s]$$

and $l = 910$ can be obtained from the expression for S above.

When the signal S is present on the signal line C-101, the signal S delayed by one line period and the signal S delayed two line periods are present on the signal lines C-102 and C-103, respectively. In this case, the transfer function $H_v(z)$ of the vertical filter can be expressed as follows:

$$H_v(z) = -(\tfrac{1}{4})(1 - 2Z^{-l} + Z^{-2l})$$
$$= -(\tfrac{1}{4})(1 - Z^{-l})^2.$$

The bandpass filter C-2 is provided to further attenuate the signal Y still remaining in the output of the vertical filter C-1. This bandpass filter C-2 is a bandpass digital filter designed to pass signals U and V having a frequency band around the center frequency $f_{sc}$.

The transfer function $H_B(z)$ of the bandpass filter C-2 is such as to satisfy the relation:

$$H_B(z) = -(1/32)(1 - Z^{-2})^2 (1 + Z^{-4})^2 (1 + Z^{-8}).$$

The output of the bandpass filter C-2 can be considered as the digital chrominance signal C, and thus $S - C = Y$ can be obtained at the output of the subtractor C-3.

A similar filter intended for use with the PAL system can be constructed taking into account the signal characteristics shown in FIG. 6. Namely, operations expressed by the following equation are carried out using an upper two adjacent lines and lower two adjacent lines next to a given line, and result is applied to the signal line C-104:

$$H_{cp}(m, 2n) = -(\tfrac{1}{4})[S(m, 2n-2) - 2S(m, 2n) + S(m, 2n+2)].$$

In this prior art system, particularly the vertical filter C-1 is configured on the assumption that the values of $\Delta Y_1$, $\Delta Y_2$, $\Delta Y_3$, $\Delta Y_4$, $\Delta C_1$, $\Delta C_2$, $\Delta C_1'$ and $\Delta C_2'$, etc., are small. Therefore, the system of the prior art is accompanied by the disadvantage that the vertical filter will not properly operate as a filter in a region where changes in luminance and chrominance of the picture image portion corresponding to the adjacent horizontal scanning line (such as a straight line in the horizontal direction) are distinctive, and thereby impurities of color and other disturbances in the picture unavoidably occur.

The present invention further relates to a subnyquist sampling filter for recovering a high quality picture signal from a quantized picture signal sampled at a sampling frequency equal to or lower than the nyquist frequency, for example, for high quality digital transmission of television picture signals.

An existing subnyquist sampling method wherein a signal is sampled with a sampling frequency lower than the nyquist frequency, will be explained referring to FIG. 9. FIG. 9 shows the allocation of a picture signal extracted by subsampling from a series of existing picture signals sampled in the form of a square lattice. In this figure, the maximum frequency of the picture signal is $f_v$, the nyquist sampling frequency of the picture signal is $f_s$, the subnyquist sampling frequency is $f_s/2$ where $f_s \geq 2f_v$. FIG. 9 also shows a two-dimensional allocation of a subnyquist sampled picture signal which has been obtained by phase inversion for each line period of horizontal scanning for a series of picture signals where the picture signal is sampled in the form of a square lattice on a two-dimensional allocation with the nyquist sampling frequency $f_s$. As shown in FIG. 9, white circles indicate sample picture elements extracted by subnyquist sampling, while black circles indicate interpolated picture elements recovered by interpolation in order to compensate for the extracted picture elements.

As described above, a subnyquist sampling method is effective as a method of highly efficient coding to reduce the amount of data during transmission and recording by reducing the number of samples of the picture signal. A prefilter which suppresses loop noise produced by the subnyquist sampling and an interpolation filter which results in less interpolation noise during recovery are required in the subnyquist sampling filter.

FIG. 10 is a block diagram indicating an example of a conventional subnyquist sampling system. FIGS. 11 and 12, respectively, are block diagrams of a prefilter and an interpolation filter used in the subnyquist sampling system of FIG. 10, In these figures, D-2 and D-10 are A/D converters and D/A converters, respectively, D-4 is a prefilter, D-6 is a subsampler, D-8 is an interpolation filter, D-12 and D-18 are line delay circuits, D-14 and D-16 are dot delay circuits, D-20 is a low-pass filter, D-22 and D-25 are subsample line delay circuits, D-27 is an average value interpolation filter, and D-29 is an interpolation switch.

Operations of the subnyquist sampling system of the prior art shown in FIG. 10 will be explained. An analog input picture signal D-1 is sampled at the nyquist sampling frequency $f_s$ by the A/D converter D-2 and converted into a digital input picture signal D-3. This digital input picture signal D-3 is subjected to suppression of high frequency components to be folded back on the low frequency components by the prefilter D-4 and is then subnyquist sampled as shown in FIG. 9 in the subsampler D-6. The subnyquist sampled subsample output picture signal D-7 is subjected to interpolation of picture elements extracted by the interpolation filter D-8, converted to a digital recovered picture signal D-9, and then converted to an analog recovered picture signal D-11 by the D/A converter D-10.

The operations of the prefilter shown in FIG. 11 will now be described. Here, a digital input picture signal D-3 is indicated by $S(m,n)$ corresponding to the picture element location When $S(m, n+1)$ indicated in FIG. 9 is input to the digital input picture signal D-3 through the line delay circuits D-12 and D-18 and the dot delay circuits D-14 and D-16, a total of five picture signals $S(m+1, n)$, $S(m, n)$, $S(m-1, n)$ and $S(m, n-1)$ (corresponding to D-13, D-15, D-17 and D-18, respectively) are output simultaneously. The low-pass filter 20 carries out the following equations on the picture signals D-3, D-13, D-15, D-17 and D-19, and also outputs the signal P(m,n) indicated below as the prefilter output picture signal D-5 for S(m,n).

$$P(m,n) = (\tfrac{1}{8})[S(m,n-1) + S(m-1,n) + 4S(m,n) + S(m+1,n) + S(m,n+1)].$$

The signal P(m,n) is an output of a two-dimensional low-pass filter D-20 which suppresses the high frequency components of the signal S(m,n) which cause loop noise.

The operations of the interpolation filter shown in FIG. 12 will be explained hereinafter. The output picture signal P(m,n) of the prefilter D-4 is reduced to a half in the amount of picture data it contains because of the skipped samplings. A series of samples of the output picture signal D-7, which is the output of subsampler D-6, are sequentially output as P(m,n−1), . . . P(m−1,n), P(m+1,n), . . . , P(m,n+1), . . . on a time-sequential basis. Accordingly, the picture signal extracted by the subsampler D-6 is recovered by the interpolation filter D-8 as explained below. The subsample line delay circuits D-22 and D-25 and the dot delay circuit D-14 simultaneously output the four picture signals of P(m−1, n), P(m+1,n) and P(m,n−1) (corresponding to D-23, D-24 and D-26) with such a timing that the signal P(m,n+1) of the subsample output picture signal D-7 is input. The average value interpolation filter D-27 recovers the interpolation picture signals Q(m,n) (D-28) indicated below corresponding to the element P(m,n) by the following processing from the picture signals mentioned above:

$$Q(m,n) = (\tfrac{1}{4})[P(m,n-1) + P(m-1,N) + P(m+1,n) + P(m,n+1)].$$

The interpolation switch D-29 alternately selects the subsample output picture signal D-23 and interpolation picture signal D-28 and obtains the recovered picture signals R(m,n) (D-9) as the time series . . . P(m,n−1), . . . Q(m−2,n), P(m−1,n), Q(m,n), P(m+1,n), . . . , P(m,n+1), . . . .

The prefilter and interpolation filter in the above subnyquist sampling system are capable of suppressing loop noise by subnyquist sampling, but, on the other hand, they reduce the two-dimensional frequency response of the original picture signal to a half. Namely, the existing subnyquist sampling system has a disadvantage that the resolution in each direction of the picture is lowered to about a half of the resolution provided in the original signal. Moreover, it is also possible to employ an interpolation filter which horizontally interpolates a lower frequency component in the horizontal direction and vertically interpolates a higher frequency component in the vertical direction and is a prefilter which is adaptive to such interpolation filter. However, this technique is also accompanied by a disadvantage that only a frequency response in two-dimensional space can be obtained as in the case of the existing subnyquist sampling system for frequency components which are high simultaneously in the vertical and horizontal directions.

SUMMARY OF THE INVENTION

An object of the present invention is to provide a YC separation comb filter having an improved response to local variations of the television signal. This is done, according to the invention by using a pair of filters for detecting variations of a sample with respect to vertically and horizontally adjacent samples and selecting the better filter for the detected variations.

Further in accordance with the present invention, there is provided a luminance signal/chrominance signal separating filter which detects the nature of the composite television signal waveform in a limited region and suitably switches between a vertical filter and horizontal filter to correctly separate luminance information and chrominance information from the television signal.

In accordance with another embodiment of the present invention, lowering of the filtering effect resulting from sudden changes of picture signal between adjacent picture elements is prevented by introducing a transversal filter in addition to the vertical filter. Similarities in the vertical direction and in the horizontal direction are detected and compared, and an output of the filter having the higher similarity is selected, taking into account the facts that picture signals for adjacent picture elements in the vertical direction are generally similar, as are picture signals for the adjacent picture elements in the horizontal direction.

Still further, the invention provides a subnyquist sampling filter with less loss of picture resolution comprising an adaptive prefilter which performs low-pass filter processing on a series of picture signals sampled in the form of a square lattice in the direction where a degree of change of picture signal level at the periphery of the extracted picture elements is a minimum, and an adaptive interpolation filter which performs interpolation processing on the picture signal obtained by subnyquist sampling, with a subsampler, the picture signal output from the adaptive prefilter in the direction where the degree of change of the picture signal level at the periphery of the extracted picture elements is a minimum.

BRIEF DESCRIPTION OF THE DRAWINGS

FIG. 19 is a block diagram indicating a subnyquist sampling system utilizing a subnyquist sampling filter of the invention;

FIG. 20 is a block diagram of an adaptive prefilter circuit used in the subnyquist sampling system of FIG. 18.

DESCRIPTION OF THE PREFERRED EMBODIMENTS

Figure 13:
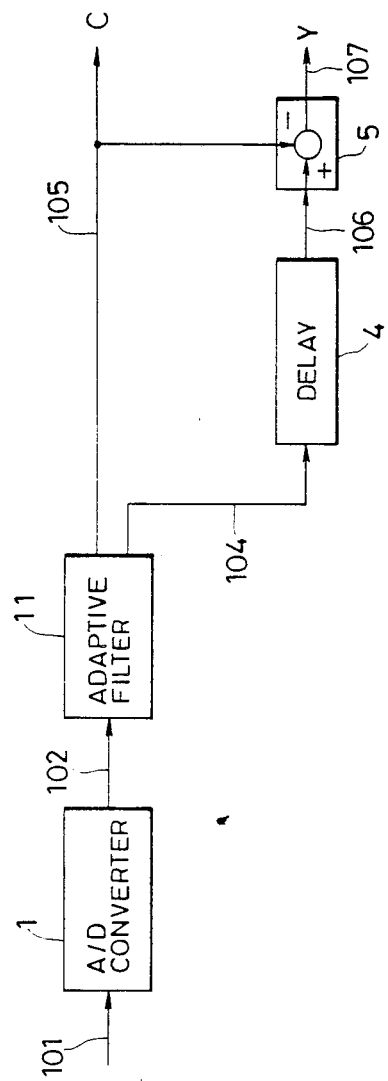
FIG. 13 is a block diagram of a first embodiment of a YC filter circuit of the invention.

In FIG. 13, a YC separation comb filter according to the present invention includes an A/D converter 1 for converting an analog NTSC signal on a line 101 into a digital signal, a vertical and horizontal adaptive filter 11 for removing the Y signal component from the output of the A/D converter 1, a delay element 4 for compensating delay introduced by the vertical and horizontal adaptive filter 11, and a subtractor 5 for deriving a difference between the output of the adaptive filter 11 and the output of the delay element 4.

In operation, a digital signal series S(i,j) obtained from the A/D converter 1 is filtered by the adaptive filter 11.

Figure 14:
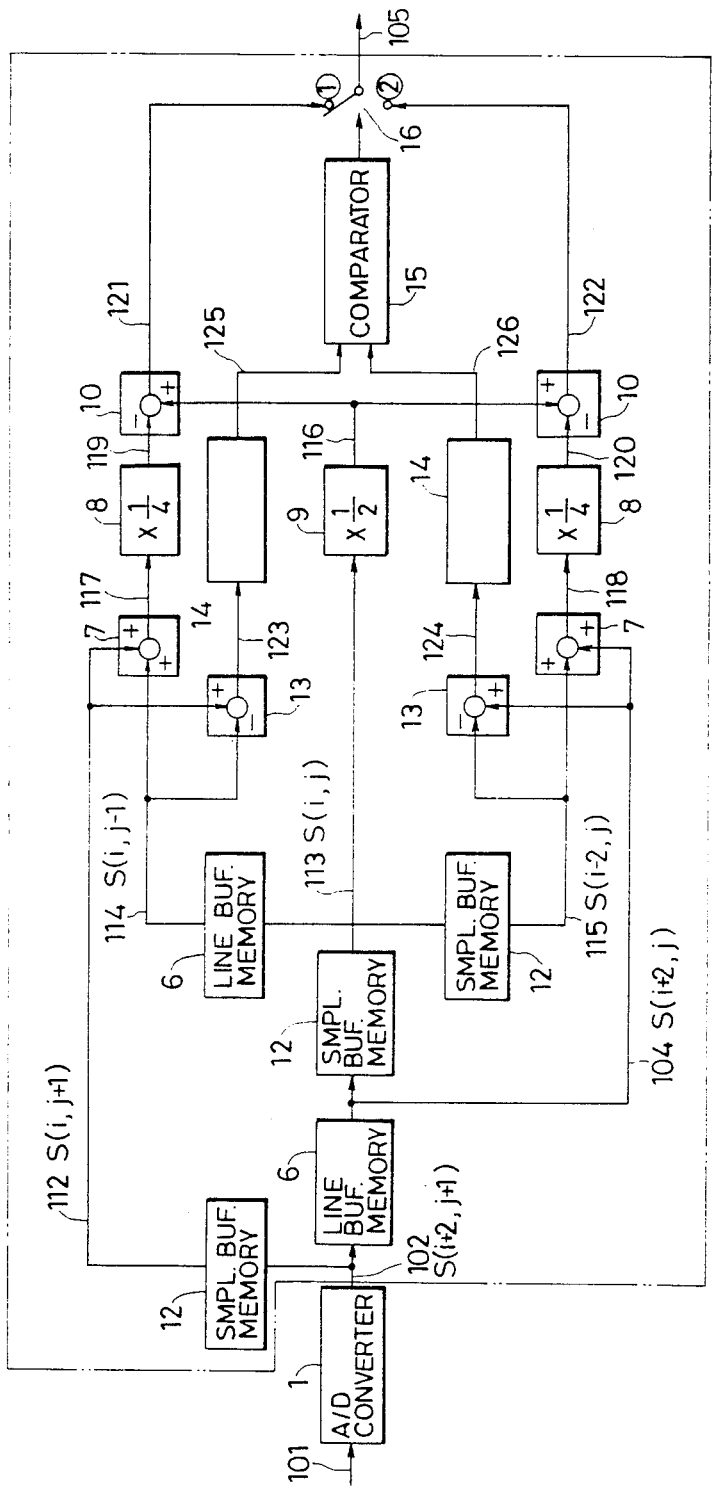
FIG. 14 is a diagram showing details of the construction of a vertical-horizontal selecting filter used in the circuit of FIG. 13.

The construction of the adaptive filter 11 is shown in FIG. 14.

As shown in FIG. 14, the adaptive filter 11 includes a first line buffer memory 6 connected to the output of the A/D converter 1 for delaying the output signal of the converter 1 on the line 102 by a time corresponding to one line, a first sample buffer memory 12 connected to the output of the A/D converter 1 for delaying the output signal of the converter 1 by a time corresponding to two samples (two dots), a second sample buffer memory 12 connected to an output of the first line buffer memory 6 for delaying the output signal of the first line buffer memory 6 on the line 104 by a time corresponding to two samples, a second line buffer memory 6 connected to an output of the second sample buffer memory 12 for delaying an output signal thereof on a line 113 by a time corresponding to one line, a third sample buffer memory 12 connected to the output of the second sample buffer memory 12 for delaying the output signal thereof by a time corresponding to two samples, a first adder 7 for summing outputs of the second line buffer memory 6 and the first sample buffer memory 12, a second adder 7 for summing the outputs of the first line buffer memory 6 and the third sample buffer memory 12, a first multiplier 8 for multiplying an output of the first adder 7 by ¼, a second multiplier 8 for multiplying an output of the second adder 7 by ¼, a third multiplier 9 for multiplying an output of the second sample buffer memory 12 by ½, a first subtractor 10 for deriving a difference between outputs of first multiplier 8 and the third multiplier 9, a second subtractor 10 for deriving a difference between outputs of the second multiplier 8 and the third multiplier 9, a third subtractor 13 for deriving a difference between the outputs of the first sample buffer memory 12 and second line buffer memory 6, a fourth subtractor 13 for deriving a difference between the outputs of the third sample buffer memory 12 and the first line buffer memory 6, a first absolute value generator 14 for obtaining an absolute value of the output of the third subtractor 13, a second absolute value generator 14 for obtaining an absolute value of the output of the subtractor 13, a comparator 15 for comparing the outputs of the first and second absolute value generators 14, and a switching device 16 responsive to an output of the comparator 15 to pass an output from either the first subtractor 10 or the second subtractor 10 to the line 105.

Figure 15:
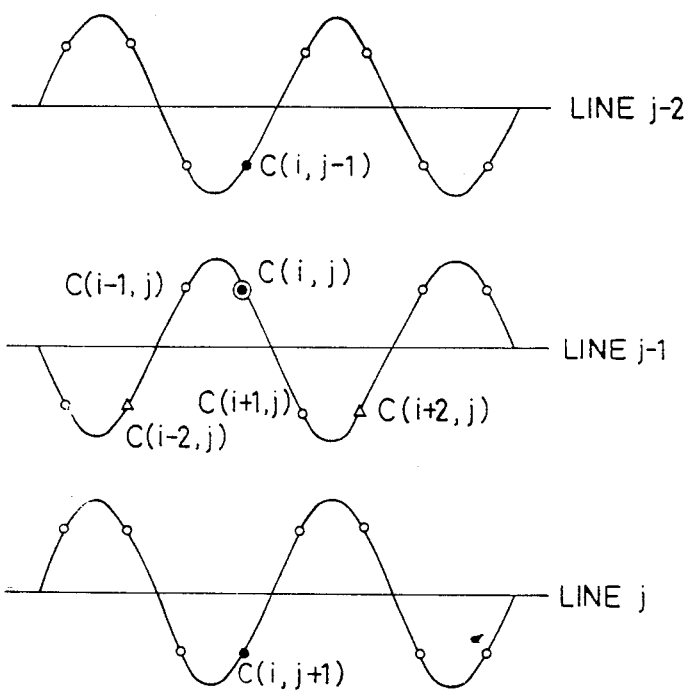
FIG. 15 is a diagram showing the arrangement of sampled image elements in one field with the color signal phase indicated, which figure is used for explaining the operations of the vertical-horizontal selecting filter of FIG. 14.

The signal C(i,j) on the line 105 for the signal S(i,j), which is digitized by the A/D converter 1, is indicated by a circle with a dot in FIG. 15. In order to obtain the value of C(i,j), the vertical and horizontal high frequency components $T_V$ and $T_H$ of the Y signal are calculated using samples S(i,j+1) and S(i,j−1) at points (shown by solid dots) remote vertically oppositely from the position (i,j) by one line, respectively, and samples S(i+2,j) and S(i−2,j) at positions (shown by triangles) remote horizontally oppositely from the position (i,j) by two dots, respectively.

$T_V = S(i,j+1) - S(i,j-1)$ and $T_H = S(i+2,j) - S(i-2,j)$.

The signals $T_V$ and $T_H$ on lines 123 and 124 are converted by the absolute value converter 14 into absolute values $|T_V|$ and $|T_H|$, which are supplied via lines 125 and 126 to the comparator 15. The comparator 15 activates the switch 16 according to the following conditions to select either the output on line 121 or on line 122 of the subtractor 10 to thereby obtain the C signal on the line 105:

when $|T_V| < |T_H|$ ... switch contact (1), and
when $|T_H| < |T_V|$ ... switch contact (2).

That is, the vertical high frequency component and the horizontal high frequency component of the Y signal for S(i,j) are obtained using the samples S(i,j+1), S(i,j−1), S(1+2,j) and S(i−2,j) at adjacent phase-inverted sample positions of the C signal, and the subsequent filtering operations are performed by using the two of these samples which have the smaller values to remove the low frequency component of the Y signal.

$H_c(i,j) = -(\frac{1}{4})S(i,j-1) + (\frac{1}{2})S(i,j) - \frac{1}{4}S(i,j+1)$, $V_c(i,j) = -(\frac{1}{4})S(i-2,j) + (\frac{1}{2})(i,j) - (\frac{1}{4})S(i+2,j)$.

Therefore, this adaptive comb filter performs its operations using the samples in the vertical direction when the switch 16 connects the contact (1) and using the samples in the horizontal direction when the switch 16 connects the contact (2). As a result, the vertical and horizontal Y signal components of the sample S(i,j) are removed and the signal $H_c$ on the line 121 or $V_c$ on the line 122 are obtained as the C signal on the line 105.

The Y signal on the line 107 at this time is obtained by the following calculation as a difference between the output signal of the delay element 4 on the line 106 and the C signal on the line 105:

$$Y(i,j) = S(i,j) - C(i,j).$$

As described hereinbefore, according to this embodiment of present invention, the adaptive filter utilizes the two-dimensional characteristics of the image signal and operates corresponding to the one of the vertical and horizontal directions in which the variation is smaller to obtain the separation between the Y and C signals. As a result, there is provided an adaptive comb filter whose response to local variations of the television signal is improved, and hence with which image degradation is minimized.

Figure 16:
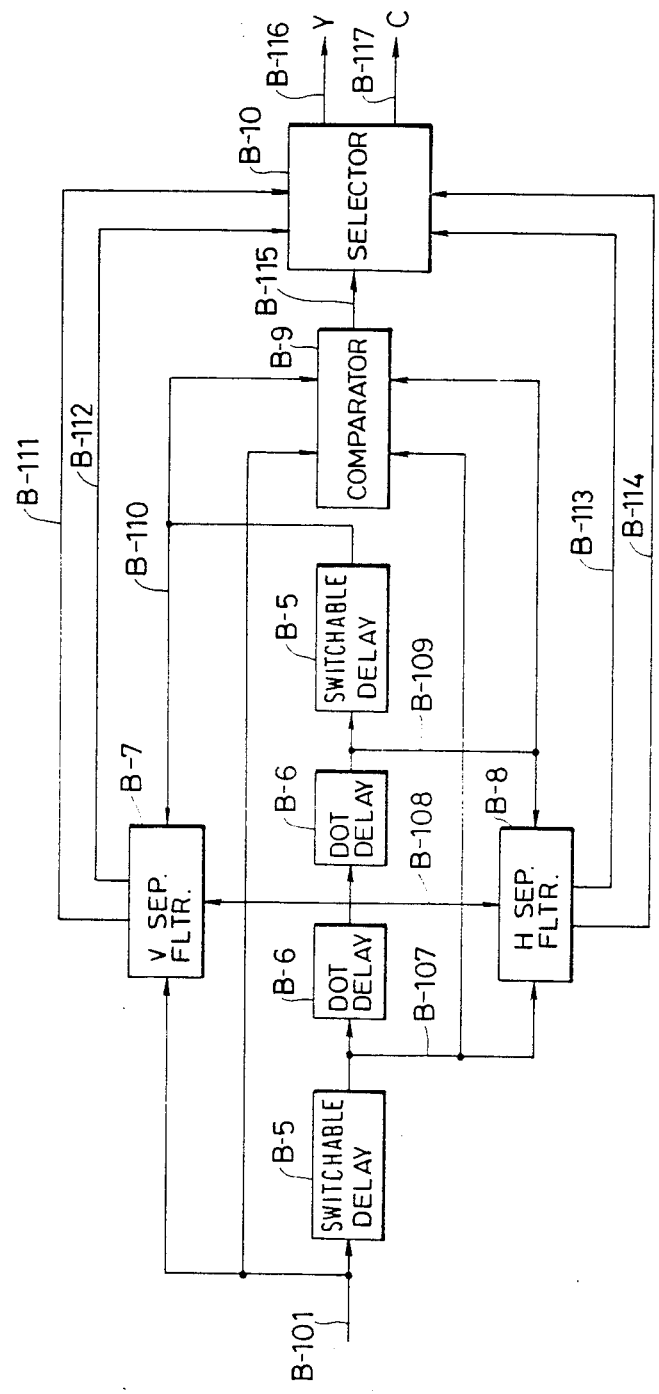
FIG. 16 is a block diagram showing the arrangement of an adaptive comb filter circuit according to the present invention.

FIG. 16 shows the construction of another embodiment of an adaptive YC signal separating comb filter according to the present invention.

In FIG. 16, reference numerals B-5, B-6, B-7, B-8, B-9 and B-10 denote a variable line delay circuit, a dot delay circuit, a vertical separating filter, a horizontal separating filter, a comparator circuit and a selector, respectively.

The operation of this embodiment of a separating filter will be described for the case of the NTSC composite color television signal.

A sample signal on line B-101 obtained by sampling the composite color television signal with a sampling frequency $f_s = 4f_{sc}$ is passed through a series connection of a pair of the variable line delay circuits B-5 and a pair of the dot delay circuits B-6 to provide, in an image frame, five sample points in a diamond lattice simultaneously. Each variable line delay circuit 5 performs a delay of $Z^{-(l-2)}$ and each dot delay circuit 6 performs a delay of $Z^{-2}$.

Figure 1:
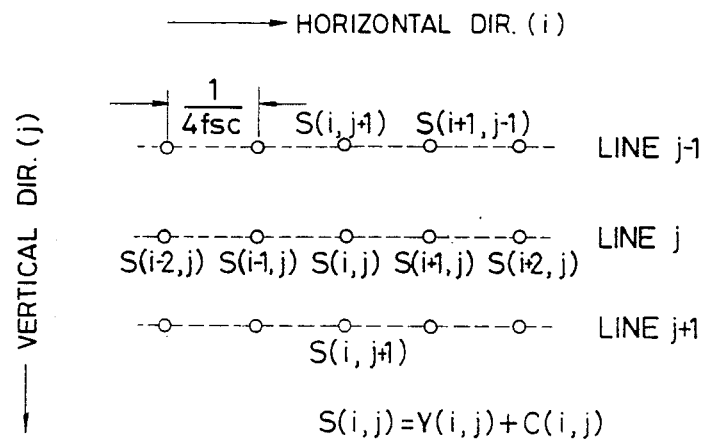
FIG. 1 is a diagram showing an arrangement of sampled image points in an NTSC signal in one field.
Figure 2:
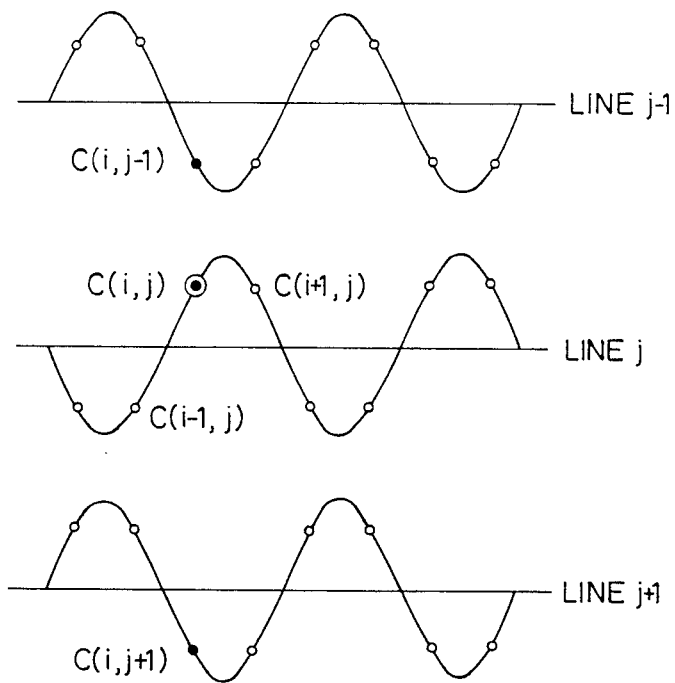
FIG. 2 is a diagram showing an arrangement of sampled image points in one field with the color signal phase indicated.
Figure 3:
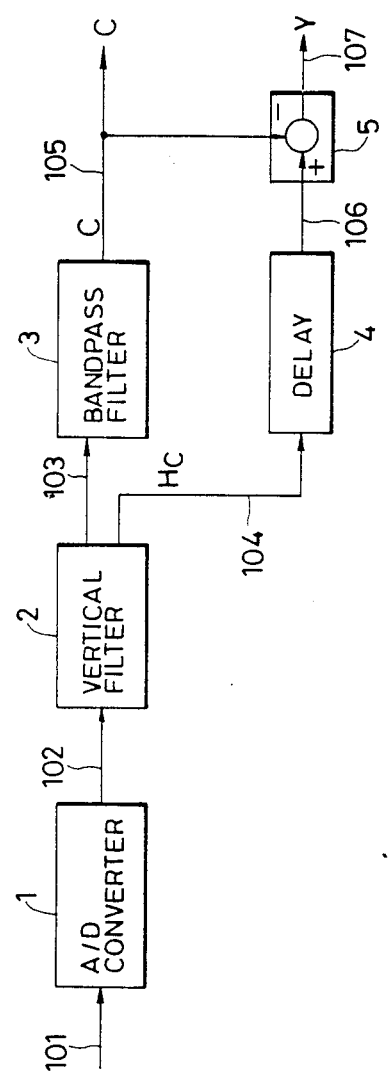
FIG. 3 is a block diagram showing the construction of a conventional YC separation filter.
Figure 4:
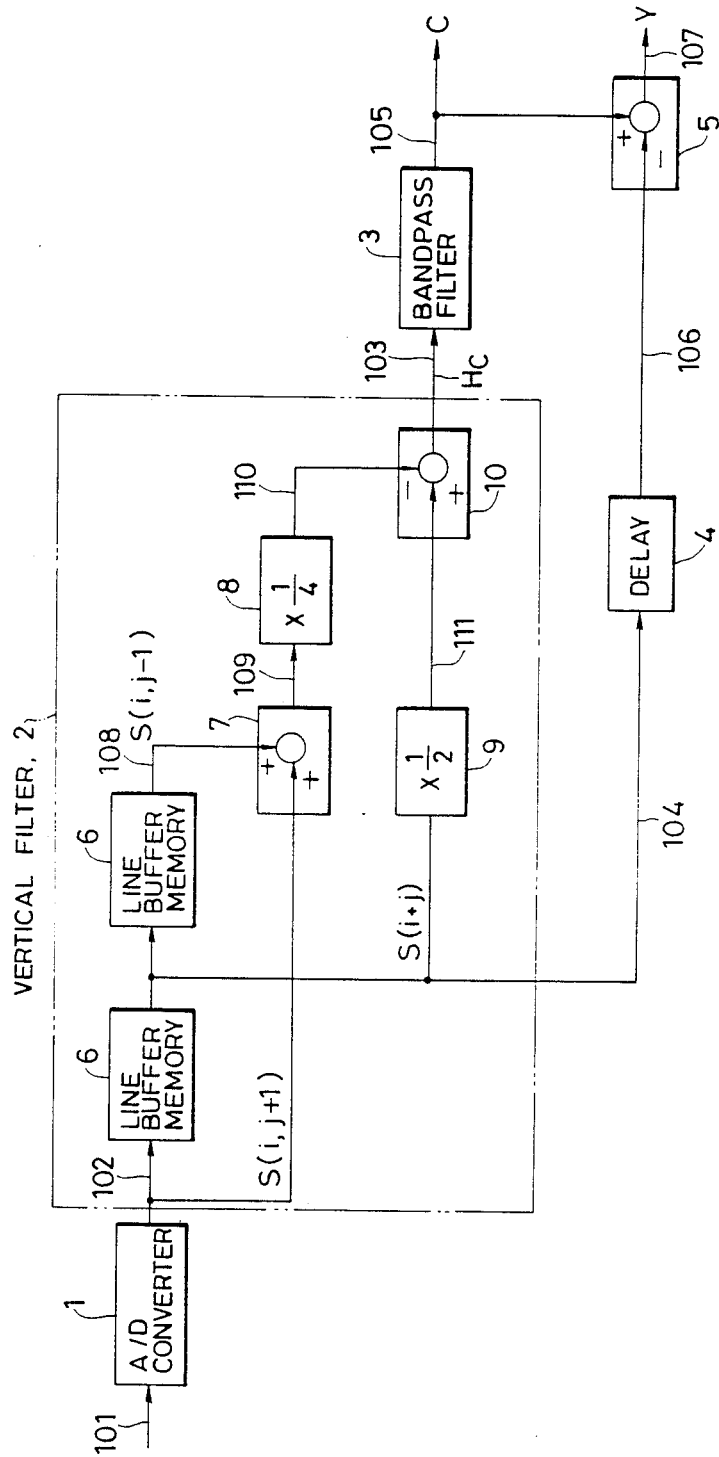
FIG. 4 shows details of the construction of a vertical filter employed in the conventional YC filter of FIG. 3.
Figure 5:
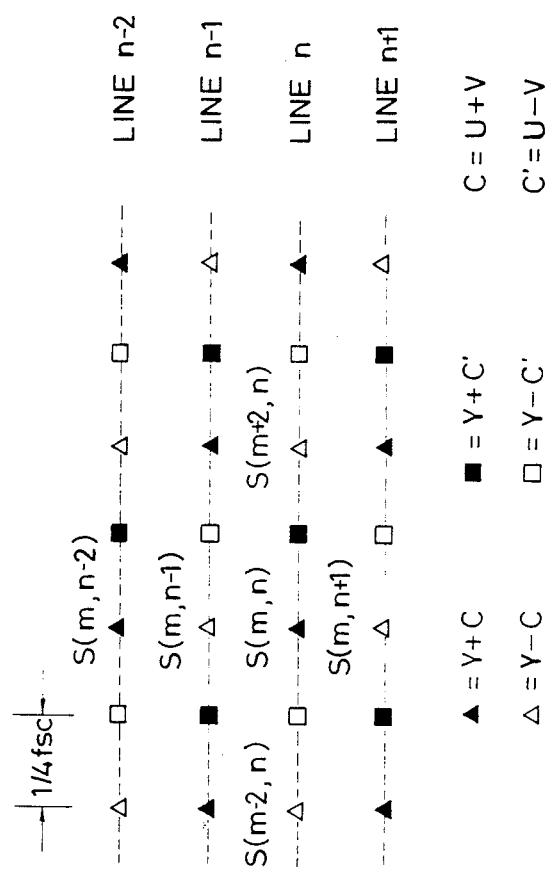
FIG. 5 shows the arrangement of samples of an NTSC composite color television signal sample in synchronizm with a color subcarrier at a sampling frequency four times the color subcarrier frequency.

The five samples, at a time when the composite color signal S(m,n) appears on line B-108, are the signal S(m,n), signals S(m,n−1) and S(m,n+1) which are just above and below the signal S(m,n) and appear on lines B-110 and B-101, respectively, and signals S(m−2,n) and S(m+2,n) which are separated horizontally oppositely from the signal S(m,n) by two samples and appear on lines B-109 and B-107, respectively, as shown in FIG. 5. Since the phase of the color subcarrier of the signals other than the signal S(m,n) differ from that of the latter signal by 180°, the vertical filter B-7 and the horizontal filter B-8 function to separate the luminance signal component and the chrominance signal component in the respective directions according to the following:

Vertical separating filter:
$Y_v(m,n) = (\frac{1}{4})[S(m,n-1) + 2S(m,n) + S(m,n+1)]$
$C_v(m,n) = -(\frac{1}{4})[S(m,n-1) - 2S(m,n) + S(m,n+1)]$
Horizontal separating filter:
$Y_h(m,n) = (\frac{1}{4})[S(m-2,n) + 2S(m,n) + S(m+2,n)]$
$C_h(m,n) = -(\frac{1}{4})[S(m-2,n) - 2S(m,n) + S(m+2,n)].$ The filter outputs $Y_v(m,n)$ on line B-111, $C_v(m,n)$ on line B-112, $Y_h(m,n)$ on line B-113, and $C_h(m,n)$ on line B-114 are supplied to the selector B-10. The comparator B-9 compares an absolute value of a difference between the signals S(m−2,n) and S(m+2,n) with an absolute value of a difference between the signals S(m,n−1) and S(m,n+1) and actuates the selector B-10 such that the selector selects an output of either the vertical or horizontal filter corresponding to the smaller absolute value.

That is, when:
$|S(m-2,n)| \geq |S(m+2,n) - S(m,n+1)|.$
the horizontal filter B-8 is selected and the output signals thereof on lines B-113 and B-114 are provided on the lines B-116 and B-117 as the luminance signal Y(m,n) and the chrominance signal C(m,n), respectively, and when:
$|S(m-2,n) - S(m+2,n)| > |S(m,n-1) - S(m,n+1)|,$
the output of the vertical filter B-7 on the lines B-111 and B-112 are used as the output signals of the adaptive comb filter. In other words, the adaptive comb filter according to the present invention utilizes four element signals, two in the horizontal direction and two in the vertical direction, to detect the one of the directions in which there is no sharp variation of the waveform and separates the luminance signal and the chrominance signal using the two signals in this one direction.

Figure 6:
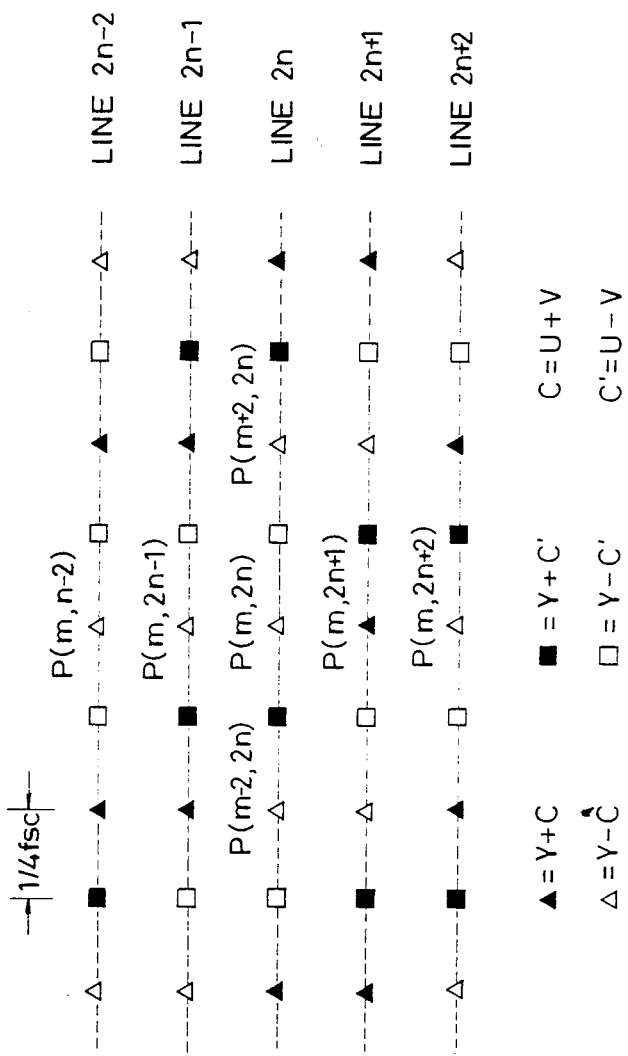
FIG. 6 is a diagram similar to FIG. 5 but corresponding to the case of a PAL television signal.
Figure 7:
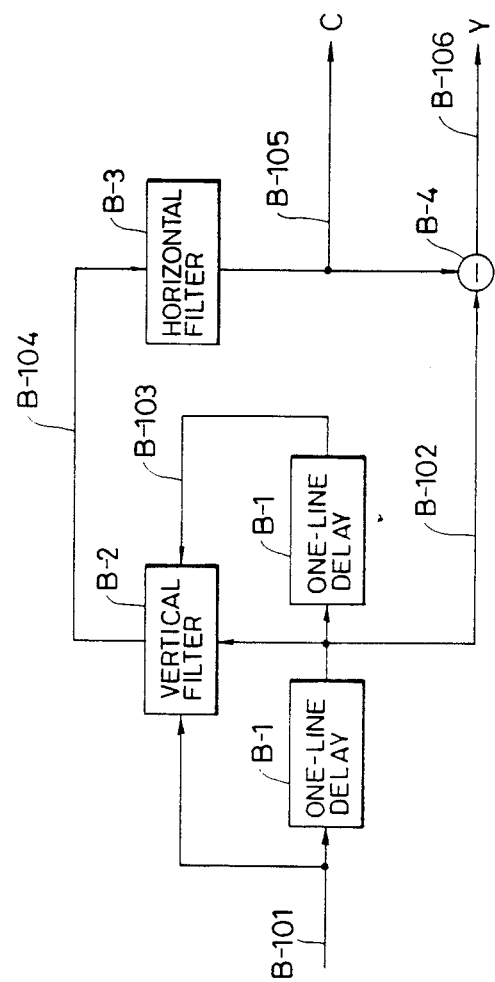
FIG. 7 is a block diagram showing the construction of another conventional YC separation filter.

As to the operation of the present adaptive comb filter for the PAL color television signal, the PAL composite color television input signal sampled in synchronism with the color subcarrier with the sampling frequency $f_s' = 4f_{sc}'$ is delayed by pair of variable line delay circuits B-5 and a pair of dot delay circuits B-6 correspondingly to $Z^{-(2l'-2)}$ and $Z^{-2}$, respectively, to provide five sample points simultaneously, where l' = 1135. When, in FIG. 6, a composite color television signal P(m,2n) at a point (m,n) appears on a line 108, signals P(m,2n−2) and P(m,2n+2) at positions remote from the point (m,n) by two lines vertically, respectively, and signals P(m−2,2n) and P(m+2,2n) at points remote from the point (m,n) by two points, horizontally respectively, are obtained together with the signal P(m,2n) simultaneously. Since the color subcarrier phases of the signals P(m,2n−2), P(m,2n+2), P(m−2,2n) and P(m+2,2n) differ from that of the signal (m,2n) by 180°, the separation of the luminance signal and the chrominance signal can be performed in the same manner as that for the NTSC color television signal. That is, the luminance signal Y(m,2n) and the chrominance signal C(m,2n) are derived as follows:

when,
$|P(m,2n - 2) - P(m,2n + 2)| \leq |P(m - 2,2n) - P(m + 2,2n)|$:
$Y(m,2n) = (\frac{1}{4})[P(m,2n - 2) + 2P(m,2n) + P(m,2n + 2)]$
$C(m,2n) = -(\frac{1}{4})[P(m,2n - 2) - 2P(m,2n) + P(m,2n + 2)]$
and when,
$|P(m,2n - 2) - P(m,2n + 2)| > |P(m - 2,2n) - P(m + 2,2n)|$:
$Y(m,2n) = (\frac{1}{4})[P(m - 2,2n) + 2P(m,2n) + P(m + 2,2n)]$
$C(m,2n) = -(\frac{1}{4})[P(m - 2,2n) - 2P(m,2n) + P(m + 2,2n)].$ A luminance signal and a chrominance signal of a composite color television signal P(m,2n+1) in an odd numbered line can be separated in the same manner using two signals at points remote vertically from the signal P(m,2n+1) by two lines, and two signals at points remote horizontally from the signal by two samples. That is, since, in the PAL system, the subcarrier phase changes every four lines, it is possible to separate with the same circuit the luminance signal and the chrominance signal using samples vertically remote from the signal by two lines.

As mentioned hereinfore, the adaptive comb filter of this embodiment is constructed such that signal components of the composite color television signal whose vertical or horizontal waveform variation is slower than the other are used to separate the luminance and chrominance signals. Therefore, it is possible to respond to sharp variations of the image to exactly separate the luminance and chrominance signal, resulting in exact reproduction of the received image signal without cross-color and/or dot disturbance.

Figure 8:
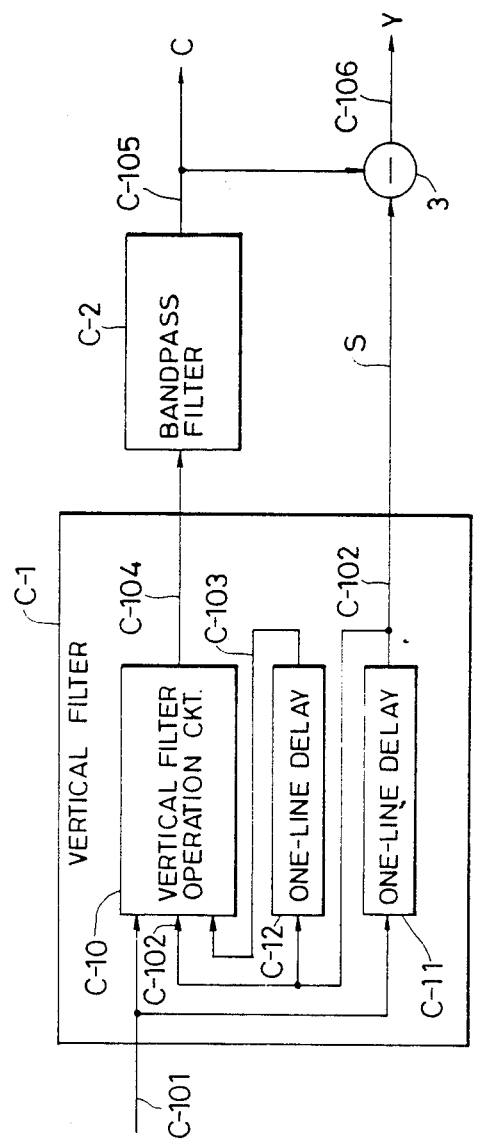
FIG. 8 is a block diagram showing another conventional YC separation filter.
Figure 17:
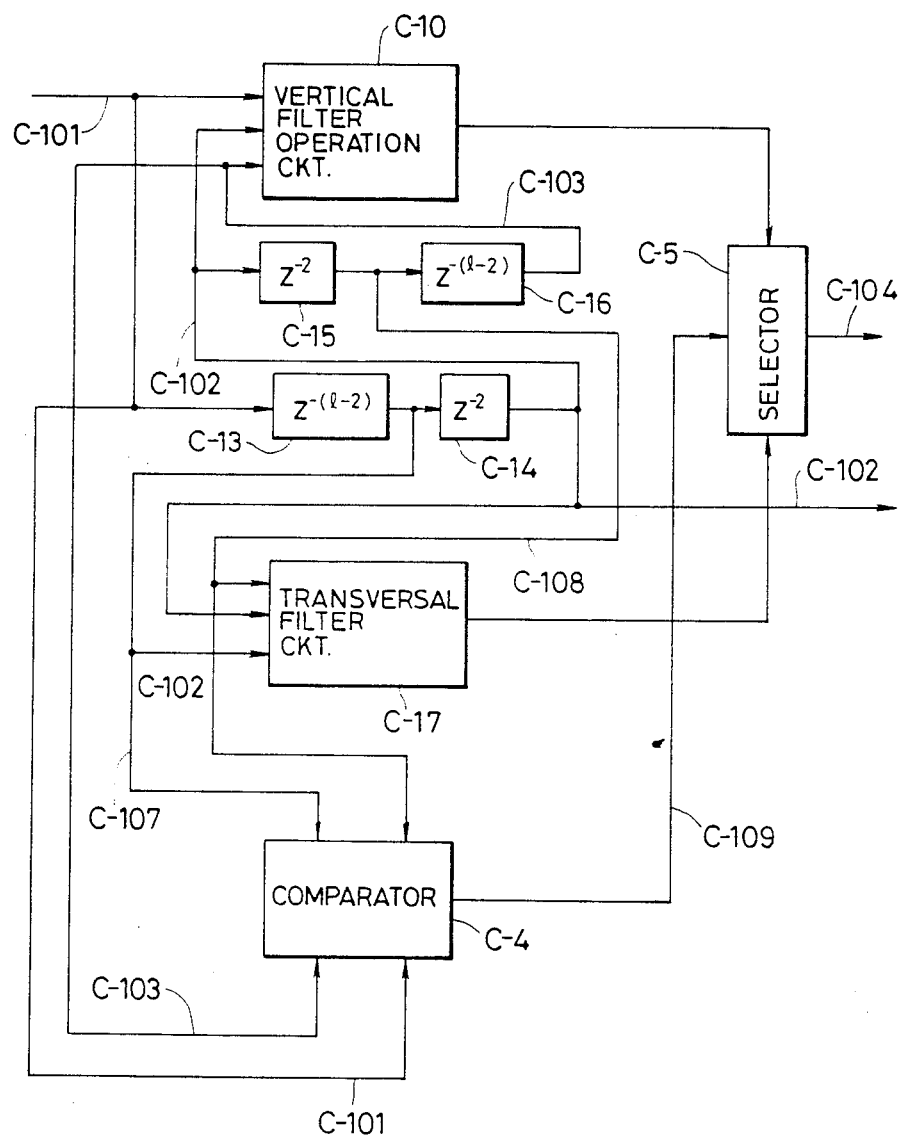
FIG. 17 is a block diagram showing another embodiment of a YC separation filter circuit of the invention.

A further embodiment of the present invention will be explained by referring to FIG. 17. In this case, $f_s = 4f_{sc}$. In FIG. 17, those components the same as or equivalent to those in FIG. 8 are identified by the same reference numeral. Further, reference numeral C-4 designates a comparator; C-5, a selector; C-13, C-14, C-15 and C-16, delay circuits; C-17, a transversal filtering circuit; and C-107, C-108 and C-109, signal lines. As in the case of FIG. 8, the signal line C-104 is connected to a bandpass filter C-2 and the signal line C-102 to the subtractor C-3, and the succeeding stage of the signal lines C-102 and C-104 is similar to the constitution of FIG. 8 and is thus is omitted in FIG. 17.

The delay circuits C-14 and C-15 delay their input signals by two sampling periods, while the delay circuits C-13 and C-16 delay their input signals by periods corresponding to one line less two sampling periods. Therefore, the delay circuit connecting the delay circuits C-13 and C-14 is equivalent to the one-line delay circuit C-11 shown in FIG. 8, while the delay circuit connecting the delay circuits C-15 and C-16 is equivalent to the one-line delay circuit C-12 shown in FIG. 8. The vertical filtering circuit C-10 executes the operation of the equation for $D_h$ below and outputs the signal $H_c(m,n)$ as explained for FIG. 8. The timing is such that the signal $S(m,n)$ shown in FIG. 5 appears as the output on the signal line C-102 and the output signal $S(m+2,n)$ appears on the signal line C-107 while the output signal $S(m-2,n)$ is appearing on the signal line C-108. The transversal filtering circuit C-17 executes the operations indicated by the equation below and outputs the signal $H_c(m,n)$. As explained above for the case of the expressions for $H_c(m,n)$, the luminance signal Y is generally attenuated sufficiently from the signal $H_{ch}(m,n)$.

The comparator C-4 determines which of the signals $H_{cv}(m,n)$ and $H_{ch}(m,n)$ includes the smaller amount of the luminance signal Y. Namely, calculations of:
$D_v = |S(m,n-1) - S(m,n+1)|$
$\bar{D}_v = |S(m-2,n) - S(m+2,n)|$
are carried out, and when $D_v < D_h$, it is judged that a smaller amount of the luminance signal Y is included in the output of the vertical filtering circuit C-10. On the other hand, when $D_v < D_h$ it is judged that a smaller amount of the luminance signal Y is included in the output the transversal filtering circuit C-17. On the signal line C-109, for example, a logic "0" is output when $D_v < D_h$, and a logic "1" when $D_v \geq D_h$. This signal controls the selector C-5. When $D_v < D_h$, the output of the operation circuit C-10 is applied to the signal line C-104, and when $D_v \geq D_h$, the output of the operation circuit C-17 is applied to the signal line C-104.

The operations of the bandpass filter C-2 and subtractor C-3 in the subsequent stages of the signal lines C-102 and C-104 are the same as those explained for the case of FIG. 8.

Figure 18:
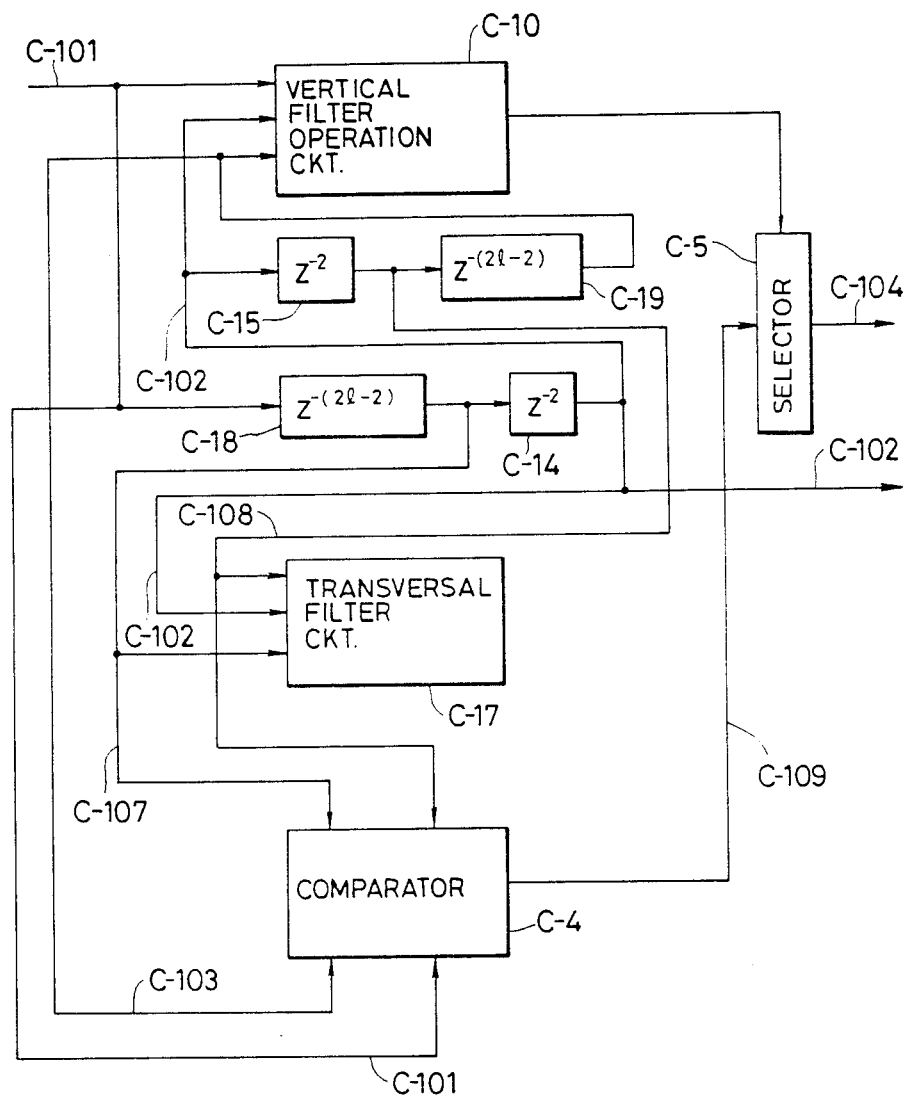
FIG. 18 is a diagram showing still another embodiment of a YC filter circuit of the invention.

FIG. 18 is a block diagram of an embodiment of the present invention for the case of the PAL system composite color television signal, and the same reference numeral as those in FIG. 17 indicate the same or corresponding circuits. Further, reference numerals C-18 and C-19 denote delay circuits providing delays of periods corresponding to two lines less two sampling periods. Therefore, the circuit connecting in series the circuits C-18 and C-14 delays the signal by two line periods, and the circuit connecting in series the circuits C-15 and C-19 delays the signal by two line periods.

With reference to FIG. 18, the operation circuit C-10 performs the calculations:

$H_{cp}(m,2n) = -(\frac{1}{4})[P(m,2n-2) - 2P(m,2n) + P(m,2n+2)]$ $H_{cp}(m,2n+1) = -(\frac{1}{4})[P(m,2n-1) - 2P(m,2n+1) + P(m,2n+3)]$.

The calculations of these equations are carried out in the same manner.

As in the case of FIG. 17, the operation circuit C-17 performs the calculations:
$H_{chp}(m,2n) = -(\frac{1}{4})[P(m-2,2n) - 2P(m,2n) + P(m+2,2n)]$.

As in the case of FIG. 17, the comparator C-4 performs the calculations:
$D_{vp} = |P(m,2n-2) - P(m,2n+2)|$
$D_{hp} = |P(m-2,2n) - P(m+2,2n)|$.

The comparator also outputs an output of the operation circuit C-10 or C-17 to the signal line C-104 in accordance with a result of comparison between $D_{vp}$ and $D_{hp}$.

In order to use the circuit of FIG. 17 for the NTSC system and the circuit of FIG. 18 for the PAL system in common, it suffices for the delay circuits C-18 and C-19 shown in FIG. 18 to be designed as variable delay circuits and for the amount of delay to be set as $Z^{-2(l-2)}$ for the PAL system and as $Z^{-(l-2)}$ for the NTSC system.

As is believed evident from above explanation, the transfer function of the circuit shown in FIG. 17 can be represented by:
when $D_v < D_h$:

$H(z) = H_v(z) = -(\frac{1}{4})(1 - Z^{-l})^2$, and when $D_v \geq D_h$:
$H(z) = H_h(z) = -(\frac{1}{4})(1 - Z^{-2})^2$.

Therefore, the transfer function of the circuit shown in FIG. 18 can be represented by:
when $D_v < D_h$:

$H(z) = H_v(z) = -(\frac{1}{4})(1 - Z^{-2l})^2$, and when $D_v \geq D_h$:
$H(z) = H_h(z) = -(\frac{1}{4})(1 - Z^{-2})^2$.

To simplify the relation between the data signals calculated by the operation circuits C-10 and C-17 shown in FIG. 17 and FIG. 18, if the signal $S(m,n)$ is considered as the pertinent data signal $S_0$, $S(m,n-1)$ is taken as $S_{-v}$, $S(m,n+1)$ is taken as $S_{+v}$, $S(m-2,n)$ as $S_{-h}$ and $S(m+2,n)$ as $S_{+h}$. If the signal $P(m,2n)$ is considered as the pertinent data signal $P_0$, $P(m,2n-2)$ is taken as $P_{-v}$, $P(m,2n+2)$ as $P_{+v}$, $P(m-2,2n)$ as $P_{-h}$, and $P(m+2,2n)$ as $P_{+h}$. In the above embodiment, $f_s = 4f_{sc}$, or, more generally $f_s = 2kf_{sc}$ ($f_{sp} = 2kf_{scp}$), where k is a positive integer.

As explained above, according to the present invention, to separate a luminance signal and a chrominance signal from a composite color television signal digitized at a sampling frequency which is 2k times the color subcarrier frequency, a transversal filter is used for the picture signal which suddenly changes vertically on the display screen and a vertical filter is used for the picture signal which suddenly changes horizontally through automatic selection by a selector. Accordingly, the present invention can provide a luminance and chrominance signals separation filter which is effective for any kind of picture signals.

A further preferred embodiment of the present invention will be explained hereinafter with reference to FIG. 19, which is a block diagram of a subnyquist sampling system utilizing a subnyquist sampling filter in accordance with the present invention. More specifically, FIG. 19 shows a block diagram of, an adaptive prefilter. FIG. 20 shows a block diagram of an adaptive interpolation filter employed in the subnyquist sampling system shown in FIG. 19. In each of these figures, D-31 is adaptive prefilter, D-34 is an adaptive interpolation filter, D-41 is an activity arithmetic operation circuit, D-48 is a comparator circuit, D-49 is a low-pass filter bank, D-57 is a selector, and D-67 is an interpolation filter bank.

An analog input picture signal D-1 is sampled by the nyquist sampling frequency $f_s$ through the A/D converter D-2 and is then converted into a digital input picture signal D-3. Regarding this digital input picture signal D-3, the adaptive prefilter D-31 monitors for all samples the degree of change of picture signal level in each direction (activity) and executes low-pass filter processing in the direction of the lowest activity. The adaptive prefilter D-31 suppresses only the signal component (for example, irregular impulse signal component) which changes sharply in any direction (horizontal, vertical or oblique). Next, the adaptive prefilter output picture signal D-32, having passed the adaptive prefilter 31, is subnyquist sampled by the subsampler D-6 at the subnyquist sampling frequency $f_s$, whereupon the adaptive prefilter output picture signal D-32 becomes the subsample output picture signal D-33 through extraction. This subsample output picture signal D-33 is transmitted and recorded. In this case, the compression rate is $\frac{1}{2}$. Thereafter, the adaptive interpolation filter D-34 monitors the image signal activity in each direction from the then-present subsample output picture signal D-33 and executes interpolation (for example, average value interpolation) through the setting of the subsample output picture signal D-33 in the direction of the lowest activity. The adaptive interpolation picture signal and sample output picture signal D-33 are alternately selected and the selected signal is sent to the D/A converter D-10 as the digital recovered picture signal D-35 having a nyquist rate of $1/f_s$, becoming the analog picture signal D-36.

Next, operations of the adaptive prefilter shown in FIG. 20 will be explained. The input digital input picture signal D-3 is delayed by the line delay circuits D-12 and D-18 and the dot delay circuits D-14 and D-16 such that the signal S(m,n+1) and following four picture signals are output simultaneously. Namely, S(m+1,n), S(m,n), S(m−1,n) and S(m,n−1) (corresponding to D-37, D-38, D-39 and D-40, respectively) appear simultaneously. With these picture signals, the activity arithmetic operation circuit D-41 calculates the activity in the six directions around the dot point S(m,n) on the display screen as indicated below:

Activity $A_1$ (m,n) in the vertical direction: =
$|S(m,n - 1) - S(m,n + 1)|$;
Activity $A_2$ (m,n) in the horizontal direction: =
$|S(m - 1,n) - S(m + 1,n)|$;
Activity $A_3$ (m,n) in the upper left direction: =
$|S(m,n - 1) - S(m - 1,n)|$;
Activity $A_4$ (m,n) in the upper right direction: =
$|S(m,n - 1) - S(m + 1,n)|$;
Activity $A_5$ (m,n) in the lower left direction: =
$|S(m - 1,n) - S(m,n + 1)|$;
Activity $A_6$ (m,n) in the lower right direction: =
$|S(m + 1,n) - S(m,n + 1)|$.

(These activities correspond to signals D-42, D-43, D-44, D-45, D-46 and D-47, respectively, indicated in FIG. 20.)

The activities $A_i$(m,n) (i=1 to 6) in the above six directions are sent to the comparison and determination circuit D-48 and the direction where the minimum activity min $A_i$(m,n) is obtained. The comparison and determination circuit D-48 outputs a code D-56 indicating the direction where the activity is a minimum. Simultaneously, the low-pass filter bank D-49 executes low-pass filter processing in the six directions using five samples of the picture signals D-3, D-37, D-38, D-39 and D-40. The output picture signals $X_i$(m,n) (i=1 to 6) of the low-pass filter bank D-49 are as follows:

Filter output $X_1(m,n)$ in the vertical direction: =
$(\frac{1}{4})[S(m,n - 1) + 2S(m,n) + S(m,n + 1)]$;
Filter output $Z_1(m,n)$ in the horizontal direction: =
$(\frac{1}{4})[(m - 1,n) + 2S(m,n) + S(m + 1,n)]$;
Filter output $X_3(m,n)$ in the upper left direction: =
$(\frac{1}{4})[S(m,n - 1) + 2S(m,n) + S(m - 1,n)]$;
Filter output $X_4(m,n)$ in the upper right direction: =
$(\frac{1}{4})[S(m,n - 1) + 2S(m,n) + S(m + 1,n)]$;
Filter output $X_5(m,n)$ in the lower left direction: =
$(\frac{1}{4})[S(m - 1,n) + 2S(m,n) + S(m,n + 1)]$;

and

Filter output $X_6(m,n)$ in the lower right direction: =
$(\frac{1}{4})[S(m + 1,n) + 2S(m,n) + S(m,n + 1)]$.

(These filter outputs correspond to signals D-50, D-51, D-52, D-53, D-54 and D-55, respectively, indicated in the drawings.)

From the above six filtered output picture signals $X_i$(m,n), $X_k$(m,n) is selected by the selector (D-57) in accordance with the code K(m,n)={[i|min-$jA_i$(m,n)]}(D-56) in the direction where the activity is a minimum, thus becoming the adaptive prefilter output picture signal X(m,n) (D-32) of the adaptive prefilter D-31. This adaptive prefilter output picture signal X(m,n) of the adaptive prefilter D-31 shows little deterioration of picture quality. Next, the adaptive prefilter output picture signal D-32 of the adaptive prefilter D-31 is subnyquist sampled through the subsampler D-6 to become the subsample output picture signal D-33. Namely, the signals . . . , X(m,n−1), . . . , X(m−1,n), X(m+1,n), . . . , X(m,n+1), . . . are obtained on a time sequential basis.

The operations of adaptive interpolation filter shown in FIG. 21 will be explained. When the signal X(m,n+1) appears as the subsample output picture signal D-33, the subsample line delay circuits D-22 and D-25 and the dot delay circuit D-14 output simultaneously the picture signals of X(m+1,n), X(m−1,n) and X(m,n−1) (corresponding to D 58, D-59 and D-60, respectively). At this time, the activity operation circuit D-41 calculates the activities $D_j$(m,n) (j=1 to 6) in the six directions around the coordinate (m,n):

Activity $B_1(m,n)$ in the vertical direction: =
$|X(m,n - 1) - X(m,n + 1)|$;
Activity $B_2(m,n)$ in the horizontal direction: =
$|X(m - 1,n) - X(m + 1,n)|$;
Activity $B_3(m,n)$ in the upper left direction: =
$|X(m,n - 1) - X(m - 1,n)|$;
Activity $B_4(m,n)$ in the upper right direction: =
$|X(m,n - 1) - X(m + 1,n)|$;
Activity $B_5(m,n)$ in the lower left direction: =
$|X(m - 1,n) - X(m,n + 1)|$;

and

-continued

Activity $B_6(m,n)$ in the lower right direction: =
$|X(m + 1,n) - X(m,n + 1)|$.

Figure 21:
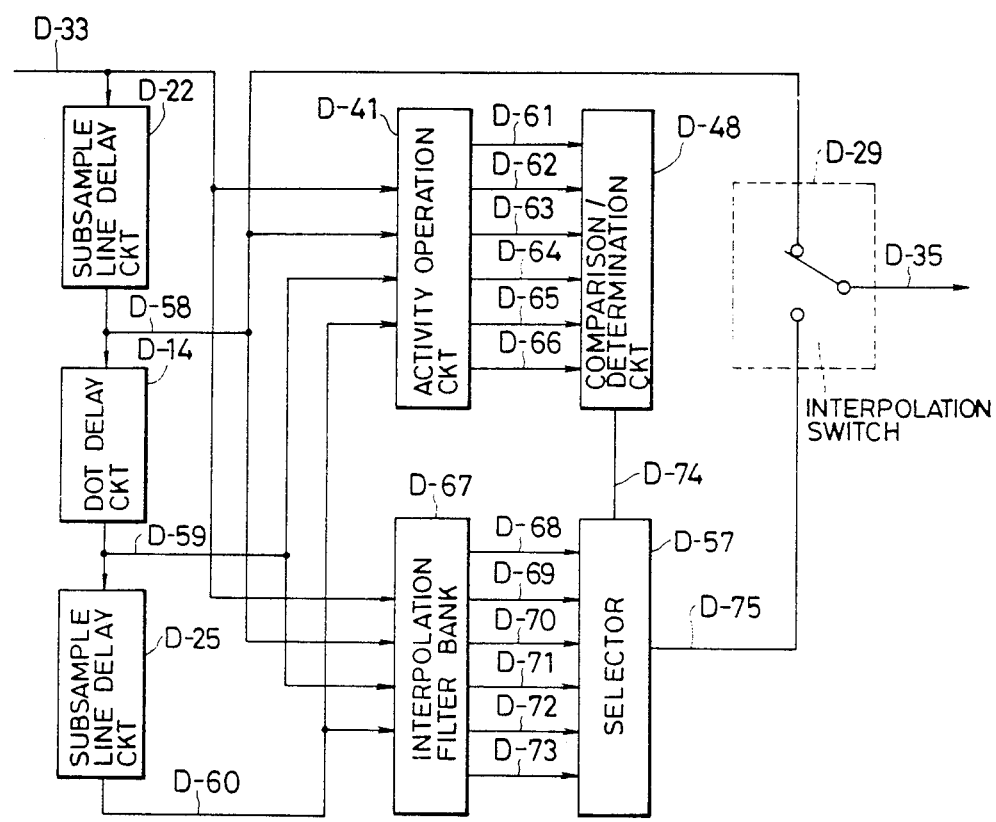
FIG. 21 is a block diagram showing an adaptive interpolation filter used in the subnyquist sampling system of FIG. 18.

(These activities correspond to signals D-61, D-62, D-63, D-64, D-65 and D-66, respectively, indicated in FIG. 21.)

The direction where the activities $B_j(m,n)$ in the six directions in the vicinity of the coordinate (m,n) of the subsample output picture signal D-33 is a minimum is obtained by the comparison and determination circuit D-48. The code $L(m,n)=\{[j\,|\,\min_j B_j(m,n)]\}$(D-74) indicating the direction where the activity is a minimum is sent to the selector D-57. Simultaneously, since the picture signals extracted by the subsampler D-6 in the interpolation filter bank D-67 are recovered by interpolation from the optimum direction, the adaptive interpolation picture signals $Y_j(m,n)$ (i=1 to 6) in each direction can be obtained as indicated below by the interpolation filters in the six directions:

Interpolation filter output $Y_1(m,n)$ in the vertical direction: =
$(\frac{1}{2})[X(m,n - 1) + X(m,n + 1)]$;
Interpolation filter output $Y_2(m,n)$ in the horizontal direction: =
$(\frac{1}{2})[X(m - 1,n) + X(m + 1,n)]$;
Interpolation filter output $Y_3(m,n)$ in the upper left direction: =
$(\frac{1}{2})[X(m,n - 1) + X(m - 1,n)]$;
Interpolation filter output $Y_4(m,n)$ in the upper right direction: =
$(\frac{1}{2})[X(m,n - 1) + X(m + 1,n)]$;
Interpolation filter output $Y_5(m,n)$ in the lower left direction: =
$(\frac{1}{2})[S(m - 1,n) + X(m,n + 1)]$;

and

Interpolation filter output $Y_6(m,n)$ in the lower right direction: =
$(\frac{1}{2})[X(m + 1,n) + X(m,n + 1)]$.

(These filter outputs correspond to signals D-68, D-69, D-70, D-71, D-72 and D-73 indicated in FIG. 21.)

These adaptive interpolation picture signals $Y_j(m,n)$ (j=1 to 6) are sent to the selector D-57 and the interpolation picture signal $Y_L(m,n)$ in the direction of minimum activity is selected and output as the adaptive interpolation picture signal Y(m,n) in accordance with the code L(m,n) in the direction of minimum activity. The interpolation switch D-29 alternately selects the subsample output picture signal D-58 at the subnyquist rate and the adaptive interpolation signal D-75 and outputs the series of samples of the digital recovery picture signal D-35 at the nyquist rate on a time-sequential basis as . . . , X(m,n−1), . . . , X(m+1,n), . . . , X(m,n+1), . . . This series of adaptive digital recovery picture signals Z(m,n) (D-35) are recovered as the adaptive analog recovery picture signal D-36 through operation of the D/A converter D-10.

As explained above, according to the subnyquist sampling system composed of the adaptive prefilter D-31, subsampler D-6, adaptive interpolation filter D-34, etc., of the present invention, pictures can be recovered with less loop noise and interpolation noise and deterioration in resolution even when the amount of data is reduced to a half.

Figure 9:
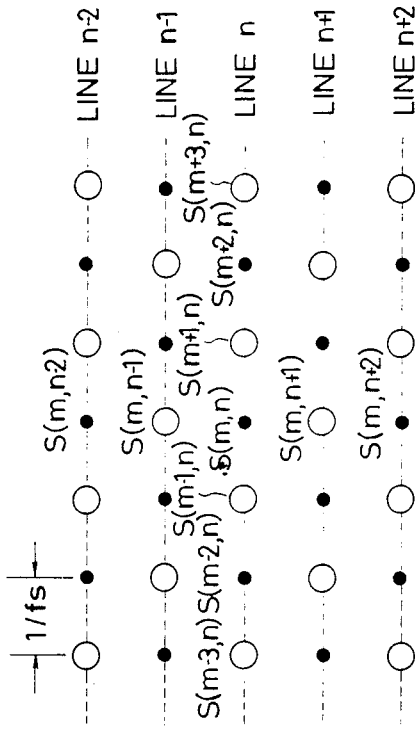
FIG. 9 is a diagram showing the arrangement of picture signal samples extracted by subsampling from a series of picture signals arranged in the form of a square lattice.
Figure 10:
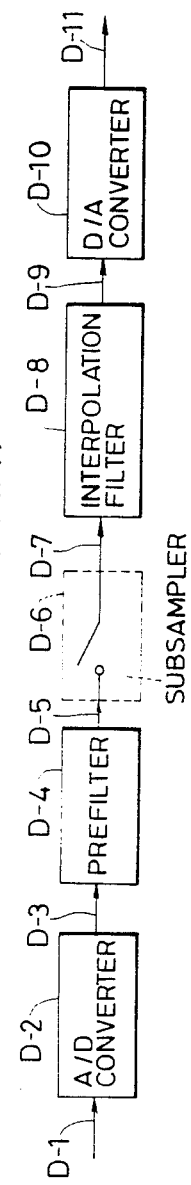
FIG. 10 is a block diagram of a conventional subnyquist sampling system.
Figure 11:
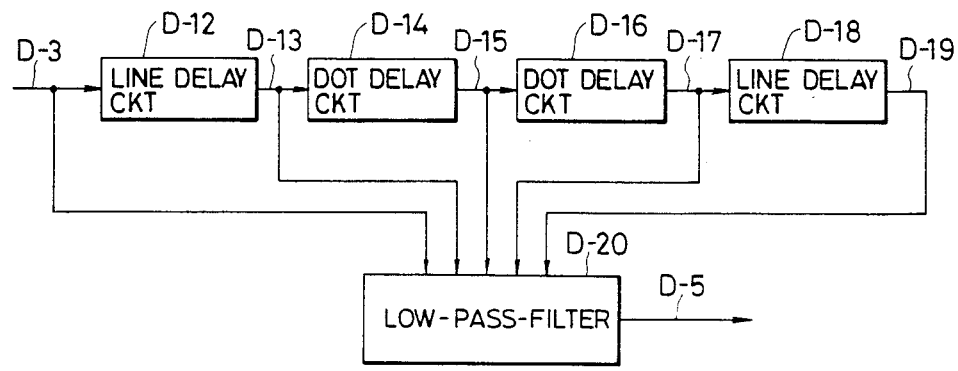
FIG. 11 and FIG. 12 are block diagrams of a prefilter circuit and an interpolation filter circuit employed in the subnyquist sampling system of FIG. 10.
Figure 12:
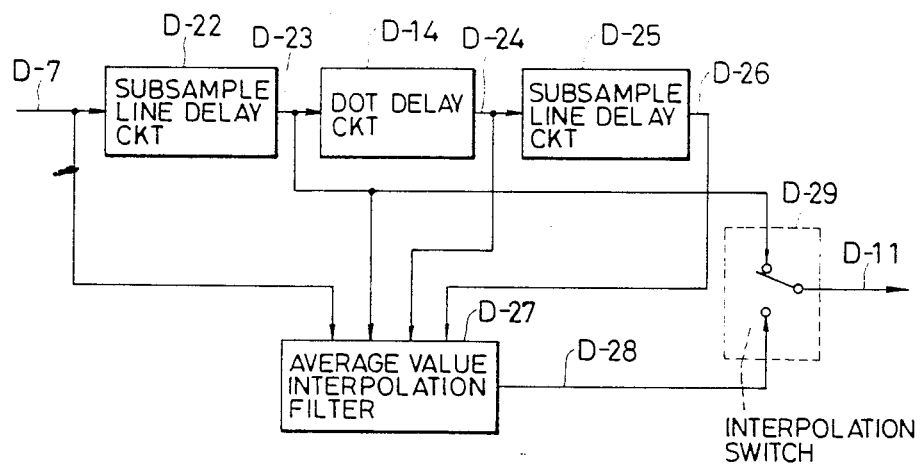

Regarding, the above embodiment, an in-field subnyquist sampling system is described, but the present embodiment can also be adapted to a subnyquist sampling system having an allocation as shown in FIG. 9 in a plurality of frame periods by introducing a frame memory. Moreover, in case the sample picture element positions are inverted alternately between the fields and frames in time, it is possible to use the interpolation filter to introduce the activity in the time direction.

In above embodiment, the filter is changed in such a direction as the minimum activity, but it is also possible to change the filter at the medium activity (center value).

We claim:

1. A filter for a composite digitized color television signal, comprising: means for detecting a direction from at least two nonparallel directions from a given image point in said composite color television signal in which a minimum amount of change in said composite color television signal occurs over a predetermined distance said detecting means determining a difference between predetermined pairs of composite samples; and means for performing a predetermined filtering operation on said composite color television signal having a filtering characteristic determined in response to a direction determined by said detecting means.

2. The filter of claim 1, wherein said predetermined filtering operation comprises separating a luminance signal and a chrominance signal from said color television signal.

3. An adaptive comb filter for separating a luminance signal and a chrominance signal from a composite color television signal, comprising: A/D converter means for sampling aid composite television signal at a sampling frequency four times a color subcarrier frequency of said television signal to digitize the latter, delay means, a control circuit and a vertical/horizontal selecting filter, said delay means comprising means for extracting from a digitized television signal a signal S(i,j−1) at an i-th sampling point in a (j−1)-th line of horizontal scanning lines on a field, a signal S(i,j) at an i-th sampling point in a j-th line, said signal S(i,j) being different in color subcarrier phase from said signal S(i,j−1) by 180°, and a signal S(i,j+1) at an i-th sampling point in a (j+1)-th scanning line, said signal S(i,j+1) being different in color subcarrier phase from said signal S(i,j) by 180°, said control circuit comprising means for calculating an absolute value V of a difference between said signals S(i,j−1) and S(i,j+1) and an absolute value H of a difference between said signal S(i+2,j) and S(i-2,j), and means for comparing said absolute value V with said absolute value H, said vertical/horizontal selecting filter comprising means for calculating a luminance signal component Y(i,j) and a chrominance signal component C(i,j) of said signal S(i,j) according to the following first equations:

$Y(i,j)=(\frac{1}{2})\{S(i,j)+(\frac{1}{2})[S(i,j-1)+S(i,j+1)]\}$ $C(i,j)=(\frac{1}{2})\{S(i,j)-(\frac{1}{2})[S(i,j-1)+S(i,j+1)]\}$ and calculating a luminance signal component Y(i,j) and chrominance signal component C(i,j) of said signal S(i,j) according to the
following second equations:

$Y(i,j)=(\frac{1}{2})\{S(i,j)+(\frac{1}{2})[S(i-2,j)+S(i+2,j)]\}$ $C(i,j)=(\frac{1}{2})\{S(i,j)-(\frac{1}{2})[S(i-2,j)+S(i+2,j)]\}$ and means for delivering an output comprising a signal expressed by said first equations when said absolute value V is smaller than said absolute value H, and a signal expressed by said second equations otherwise.

4. An adaptive comb filter comprising: a variable delay circuit for extracting simultaneously from a signal obtained by synchronously sampling an NTSC composite color television signal with a sampling frequency four times a color subcarrier frequency thereof a pair of horizontal sample signals in one scanning line, said horizontal sample signals being separated from a given sample signal in said one scanning line by two sample signals in opposite respective directions, said horizontal sample signals being different in color subcarrier phase from said given sample signal by 180° and a pair of vertical sample signals in scanning lines immediately above and below said one scanning line, said vertical sample signals being different in phase from said one sample signal by 180°, and means for extracting simultaneously from a signal obtained by synchronously sampling a PAL composite color television signal with a sampling frequency four times a color subcarrier frequency thereof a pair of horizontal sample signals in one scanning line, said horizontal sample signals being separated from a given sample signal in said one scanning line by two sample signals in opposite directions, said horizontal sample signals being different in color subcarrier phase from said given sample signal by 180°, and a pair of vertical sample signals in scanning lines above and below said one scanning line, said vertical sample signals being different in phase from said given sample signal by 180°, a comparator for comparing an absolute value of a difference between said horizontal sample signals with an absolute value of a difference between said vertical sample signals to determine which absolute value is the smaller, a horizontal separation filter constituting a secondary digital filter for providing a luminance signal and a chrominance signal separately through predetermined operations on said horizontally adjacent sample signals, a vertical separation filter constituting a secondary digital filter for providing a luminance signal and a chrominance signal separately through predetermined operations on said vertically adjacent sample signals, and a selector responsive to a determination output of said comparator for selecting one of said separation filters, said luminance and chrominance outputs from said selected separation filter being used as a luminance signal output and a chrominance signal output of said adaptive comb filter.

5. An adaptive comb filter comprising: a variable delay circuit for extracting simultaneously from a signal obtained by synchronously sampling an NTSC composite color television signal with sampling frequency four times a color subcarrier frequency thereof a pair of horizontal sample signals in one scanning line, said horizontal sample signals being separated from a given sample signal in said one scanning line by two sample signals in opposite respective directions, said horizontal sample signals being different in color subcarrier phase from said certain sample signal by 180°, and a pair of vertical sample signals in scanning lines immediately above and below said one scanning line, said vertical sample signals being different in phase from said given sample signal by 180°, a comparator for comparing an absolute value of a difference between said horizontal sample signals with an absolute value of a difference between said vertical sample signals to determine which absolute value is the smaller, a horizontal separation filter constituting a secondary digital filter for providing a luminance signal and a chrominance signal separately through predetermined operations on said horizontally adjacent sample signals, a vertical separation filter constituting a secondary digital filter for providing a luminance signal and a chrominance signal separately through predetermined operations on said vertically adjacent sample signals, and a selector responsive to a determination output of said comparator for selecting one of said separation filters, said luminance and chrominance outputs from said selected separation filter being used as a luminance signal output and a chrominance signal output of said adaptive comb filter.

6. An adaptive comb filter comprising: a variable delay circuit for extracting simultaneously from a signal obtained by synchronously sampling a PAL composite color television signal with a frequency four times a color subcarrier frequency thereof a pair of horizontal sample signals in one scanning line, said horizontal sample signals being separated from a given sample signal in said one scanning line by two sample signals in opposite directions, said horizontal sample signals being different in color subcarrier phase from said given sample signal by 180°, and a pair of vertical sample signals in scanning lines above and below said one scanning line, said vertical sample signals being different in phase from said given sample signal by 180°, a comparator for comparing an absolute value of a difference between said horizontal sample signals with an absolute value of difference between said vertical sample signals to determine which absolute value is the smaller, a horizontal separation filter constituting a secondary digital filter for providing a luminance signal and a chrominance signal separately through predetermined operations on said horizontally adjacent sample signals, a vertical separation filter constituting a secondary digital filter for providing a luminance signal and a chrominance signal separately through predetermined operations on said vertically adjacent sample signals, and a selector responsive to a determination output of said comparator for selecting one of said separation filters, said luminance and chrominance outputs from said selected separation filter being used as a luminance signal output and a chrominance signal output of said adaptive comb filter.

7. A luminance and chrominance signal separation filter comprising:
- vertical filter means for determining one-fourth of a result obtained by subtracting a sum of a data signal $S_{-v}$ occurring in the same position as a data signal $S_O$ in the line one line before said data signal $S_O$ and the data signal $S_{+v}$ allocated in the same line as a data signal $S_O$ in the line one line after the said data signal $S_O$ from two times said data signal $S_O$ for a data signal digitized at a sampling frequency which is equal to 2 k times a color subcarrier frequency, (where k is a positive integer) from an NTSC composite color television signal;
- transversal filter means for determining one-fourth of a result obtained by subtracting a sum of a data signal $S_{-h}$ specified sampling points before the said data signal $S_O$ in the same line as said data signal $S_O$ and a data signal $S_{+h}$ specified sampling points after said data signal $S_O$ from two times of said data signal $S_O$;
- comparator means for comparing an absolute value $D_v$ of a difference between said data signals $S_{-v}$ and $S_{+v}$ ($D_v = |S_{-v} - S_{+v}|$) and an absolute value $D_h$ of said data signals $S_{-h}$ and $S_{+h}$ ($D_h = |S_{-h} - S_{+h}|$);
- selector means for outputting one of an output of said vertical filter and an output of said transversal filter selected in accordance with a comparison result of said comparator means; and
- bandpass filter means responsive to an output of said selector means for outputting only a specified frequency band around said color subcarrier frequency.

8. A luminance and chrominance signal separation filter comprising:
   a vertical filter means for determining one-fourth of a result obtained by subtracting a sum of a data signal $P_{-v}$ occurring in the same line as a data signal $P_O$ in the line two lines before said data signal $P_O$ and the data signal $P_{+v}$ allocated in the same positive as a data signal $P_O$ in the line two lines after the said data signal $P_O$ from two times said data signal $P_O$ for the data signals digitized at a sampling frequency which is equal to 2k times a color subcarrier frequency where (k is a positive integer) from a PAL composite color television signal;
   transversal filter means for determining one-fourth of a result obtained by subtracting a sum of a data signal $P_{-h}$ specified sampling points before the said data signal $P_O$ in the same line as said data signal $P_O$ and data signal $P_{+h}$ specified sampling points after said data signal $P_O$ from two times said data signal $P_O$;
   comparator means for comparing an absolute value $D_{vp}$ of said data signals $P_{-v}$ and $P_{+v}$ ($D_{vp}=|P_{-v}-P_{+v}|$) and an absolute value $D_{hp}$ of said data signals $P_{-h}$ and $P_{+h}$ ($D_{hp}=|P_{-h}-P_{+h}|$);
   selector means for outputting one of an output of said vertical filter and an output of said transversal filter selected in accordance with a comparison result of said comparator means; and
   bandpass filter means responsive to an output of said selector means for outputting only a specified frequency band around said color subcarrier frequency.

9. A system for separating luminance and chrominance components from composite video signal, comprising:
   a signal input port for applying said composite video signal;
   a plurality of cascade connected delay elements serially connected to said signal input port, having a central output tap and pairs of further output taps, the output taps of each pair being symmetrically disposed about said center tap;
   signal differencing means coupled to each of said pairs of taps for producing respective signals corresponding to the magnitude of the value of amplitude difference of signal occurring between each pair of taps;
   decoder circuitry coupled to said respective means and responsive to said magnitude of amplitude difference, for generating control signals;
   means responsive to said control signals and coupled to said taps for producing an output signal corresponding to one of said luminance and chrominance components, said output signal being the linear combination of signals from said center tap and respective signals from one of the pairs of taps.

10. A filter for a composite video signal, comprising:
   a signal input port;
   delay means having a plurality of taps, pairs of said taps being symmetrically disposed with respect to a central tap;
   signal differencing means coupled to each of said pairs of taps;
   means for producing a control signal in response to outputs of said signal differencing means, and
   means for performing a filtering operation upon said composite video signal, said filtering operation being selected in response to said control signal.

* * * * *